(12) United States Patent
Spiro

(10) Patent No.: US 11,085,627 B2
(45) Date of Patent: Aug. 10, 2021

(54) ELONGATED MODULAR HEATSINK WITH COUPLED LIGHT SOURCE LUMINAIRE

(71) Applicant: Daniel S. Spiro, Scottsdale, AZ (US)

(72) Inventor: Daniel S. Spiro, Scottsdale, AZ (US)

(73) Assignee: Exposure Illumination Architects, Inc., Scottsdale, AZ (US)

( * ) Notice: Subject to any disclaimer, the term of this patent is extended or adjusted under 35 U.S.C. 154(b) by 0 days.

(21) Appl. No.: 16/672,218

(22) Filed: Nov. 1, 2019

(65) Prior Publication Data

US 2020/0063953 A1    Feb. 27, 2020

Related U.S. Application Data

(63) Continuation-in-part of application No. PCT/US2019/033152, filed on May 20, 2019, which is a continuation of application No. 16/019,329, filed on Jun. 26, 2018, now Pat. No. 10,502,407.

(60) Provisional application No. 62/674,431, filed on May 21, 2018.

(51) Int. Cl.
| | |
|---|---|
| *F21V 29/74* | (2015.01) |
| *H01L 33/64* | (2010.01) |
| *F21V 5/04* | (2006.01) |
| *F21V 15/01* | (2006.01) |
| *F21Y 115/10* | (2016.01) |

(52) U.S. Cl.
CPC .............. *F21V 29/74* (2015.01); *F21V 15/01* (2013.01); *F21V 5/04* (2013.01); *F21Y 2115/10* (2016.08); *H01L 33/642* (2013.01)

(58) Field of Classification Search
CPC ........ F21V 15/01; F21V 29/74; F21Y 2115/10
See application file for complete search history.

(56) References Cited

U.S. PATENT DOCUMENTS

| | | | |
|---|---|---|---|
| 6,428,183 B1 | 8/2002 | McAlpin | |
| 7,959,319 B2 | 6/2011 | Chien | |
| 8,246,209 B2 | 8/2012 | Lai | |
| 8,287,144 B2* | 10/2012 | Pedersen | H05B 45/00 362/217.01 |
| 8,408,742 B2* | 4/2013 | Tran | F21S 4/28 362/249.02 |
| 8,419,223 B2* | 4/2013 | Withers | F21V 19/008 362/294 |
| 8,899,778 B2* | 12/2014 | Yang | F21V 29/505 362/217.09 |
| 9,267,650 B2 | 2/2016 | Simon | |
| 9,574,717 B2 | 2/2017 | Scapa | |
| 9,644,800 B2 | 5/2017 | Purdy | |
| 9,644,828 B1* | 5/2017 | May | H01R 33/94 |

(Continued)

FOREIGN PATENT DOCUMENTS

| | | |
|---|---|---|
| WO | WO 2013/090536 | 6/2013 |
| WO | WO 2017/108446 | 6/2017 |

OTHER PUBLICATIONS

Extended Search Report issued in Appl. No. EP20205197.5 (dated Mar. 5, 2021).

*Primary Examiner* — Leah Simone Macchiarolo
(74) *Attorney, Agent, or Firm* — Michael Carrillo; Irina Sullivan; Barnes & Thornburg LLP

(57) ABSTRACT

An elongated, slimline structure having a monolithically fabricated heatsink core and heat dissipating fins, coupled to a light source wherein the elongated structure substitutes for a light source retained by a luminaire housing.

22 Claims, 23 Drawing Sheets

(56) References Cited

U.S. PATENT DOCUMENTS

| | | |
|---|---|---|
| 9,846,272 B2 | 12/2017 | Dau |
| 10,047,943 B2 | 8/2018 | Storey |
| 10,125,946 B2 | 11/2018 | Meerbeek |
| 10,203,103 B2 | 2/2019 | Bendtsen et al. |
| 10,378,742 B1* | 8/2019 | Rao .......................... F21S 9/00 |
| 10,458,638 B1* | 10/2019 | Tirosh ..................... F21V 23/04 |
| 10,551,046 B1* | 2/2020 | Tang ........................ F21K 9/272 |
| 10,845,034 B2* | 11/2020 | Nichols ................. F21V 7/0091 |
| 2008/0037239 A1* | 2/2008 | Thomas ................... F21V 29/83 |
| | | 362/92 |
| 2008/0314944 A1 | 12/2008 | Tsai |
| 2009/0190350 A1 | 7/2009 | Tseng |
| 2010/0002426 A1 | 1/2010 | Wu |
| 2010/0296285 A1 | 11/2010 | Chemel et al. |
| 2010/0301773 A1 | 12/2010 | Chemel |
| 2011/0075416 A1 | 3/2011 | Chou |
| 2011/0141723 A1 | 6/2011 | Lai |
| 2011/0141724 A1 | 6/2011 | Erion |
| 2011/0235318 A1 | 9/2011 | Simon |
| 2011/0286208 A1* | 11/2011 | Chen ......................... F21K 9/20 |
| | | 362/217.1 |
| 2011/0304270 A1* | 12/2011 | Scarpelli ................... F21S 4/28 |
| | | 315/113 |
| 2012/0026729 A1* | 2/2012 | Sanchez ................... F21K 9/27 |
| | | 362/218 |
| 2012/0212953 A1 | 8/2012 | Bloom |
| 2012/0218757 A1* | 8/2012 | Gill ......................... F21V 29/74 |
| | | 362/235 |
| 2013/0003346 A1* | 1/2013 | Letoquin ............... F21V 29/773 |
| | | 362/84 |
| 2013/0039041 A1 | 2/2013 | Yeh |
| 2013/0050998 A1 | 2/2013 | Chu |
| 2013/0119896 A1 | 5/2013 | Fukano |
| 2013/0148351 A1 | 6/2013 | Georgitsis et al. |
| 2014/0126190 A1 | 5/2014 | Dixon |
| 2014/0313711 A1* | 10/2014 | Hwu ....................... F21V 23/00 |
| | | 362/218 |
| 2015/0211710 A1 | 7/2015 | Speier |
| 2015/0300617 A1 | 10/2015 | Katona |
| 2015/0345743 A1 | 12/2015 | Trincia |
| 2017/0023193 A1* | 1/2017 | Thosteson ............. H05B 47/19 |
| 2017/0254493 A1 | 9/2017 | Giorgini |

\* cited by examiner

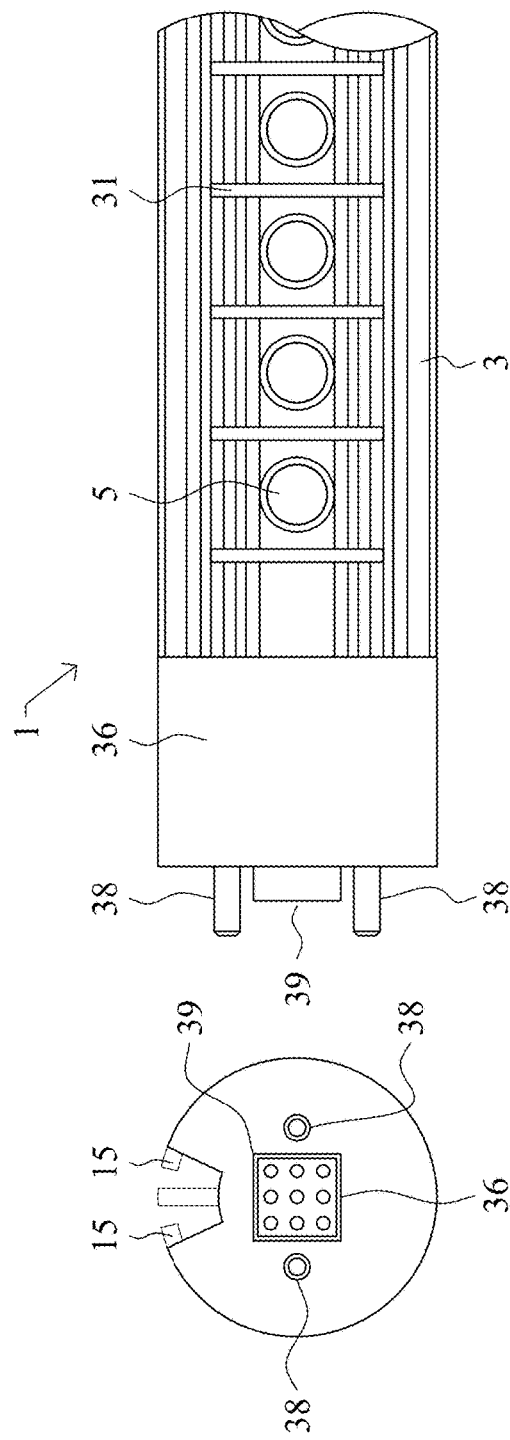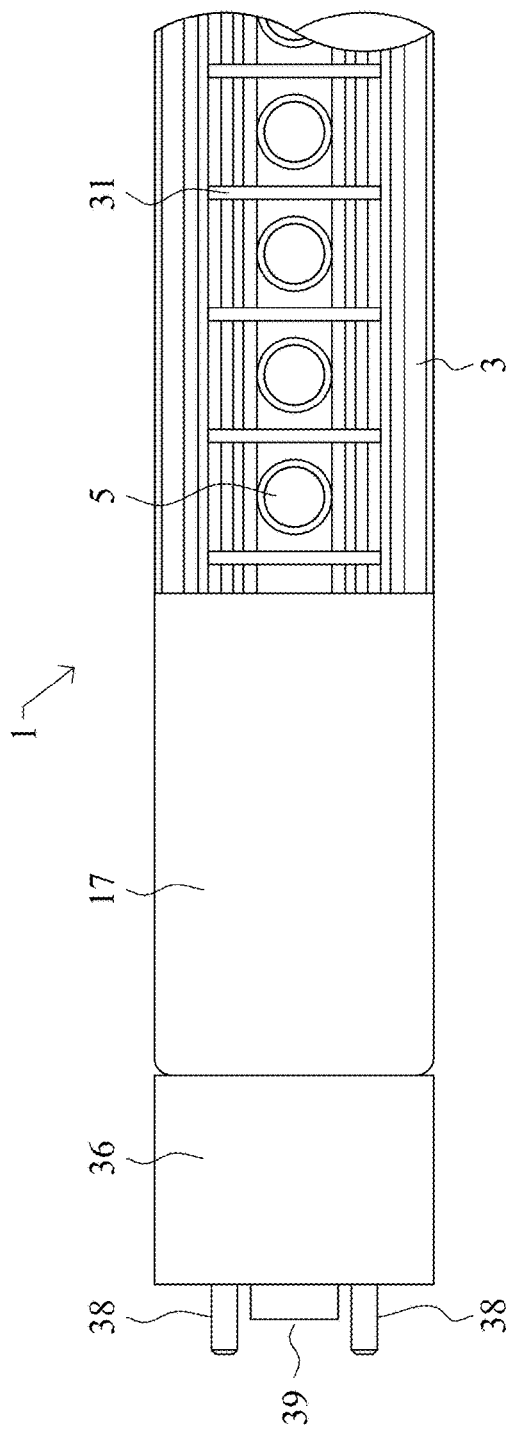

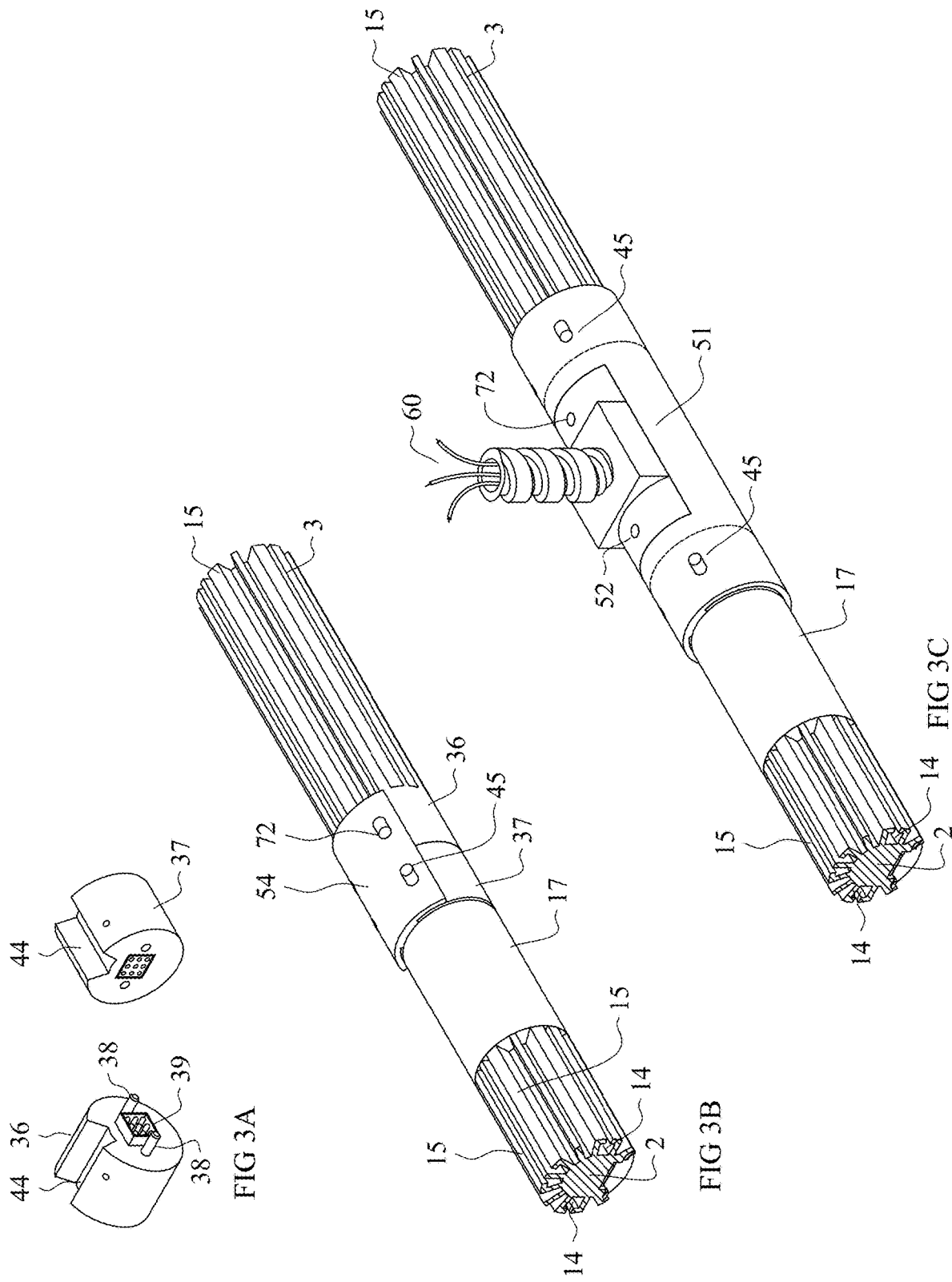

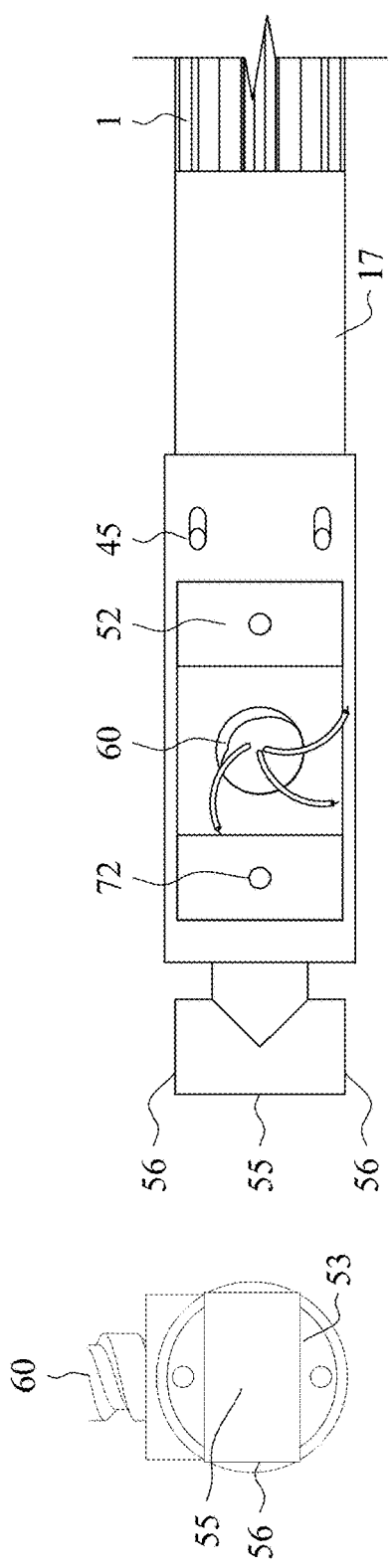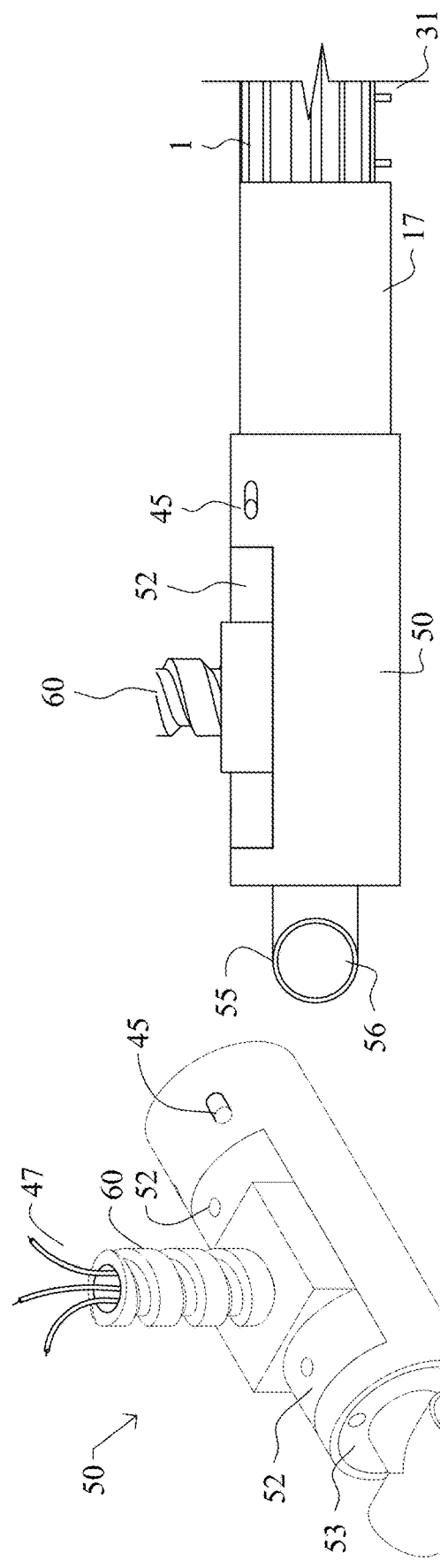
FIG 5A
FIG 5B
FIG 5C
FIG 5D

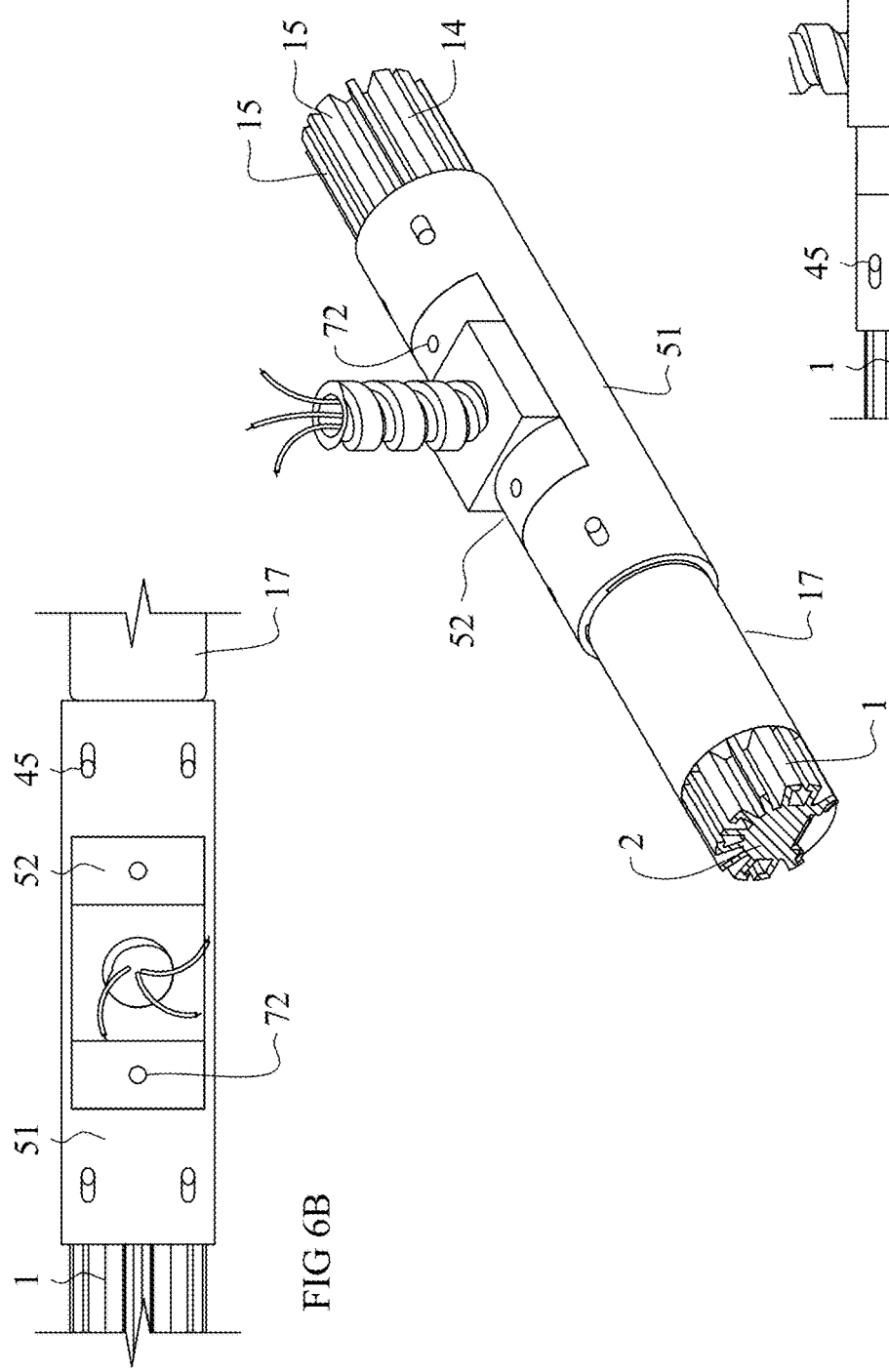

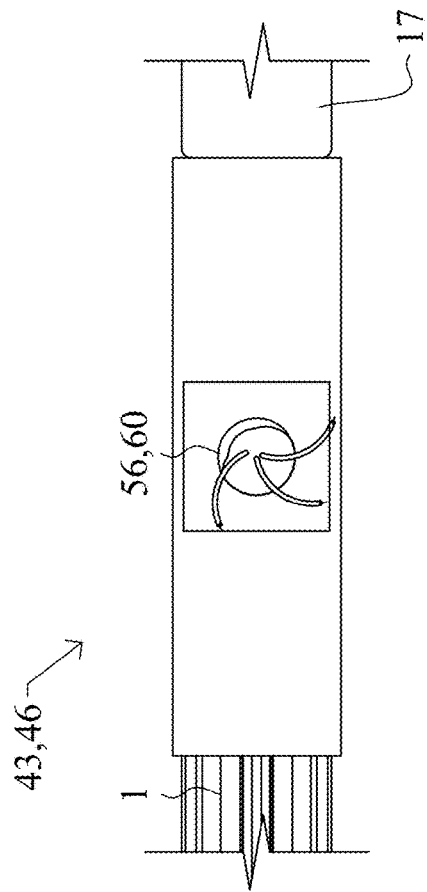
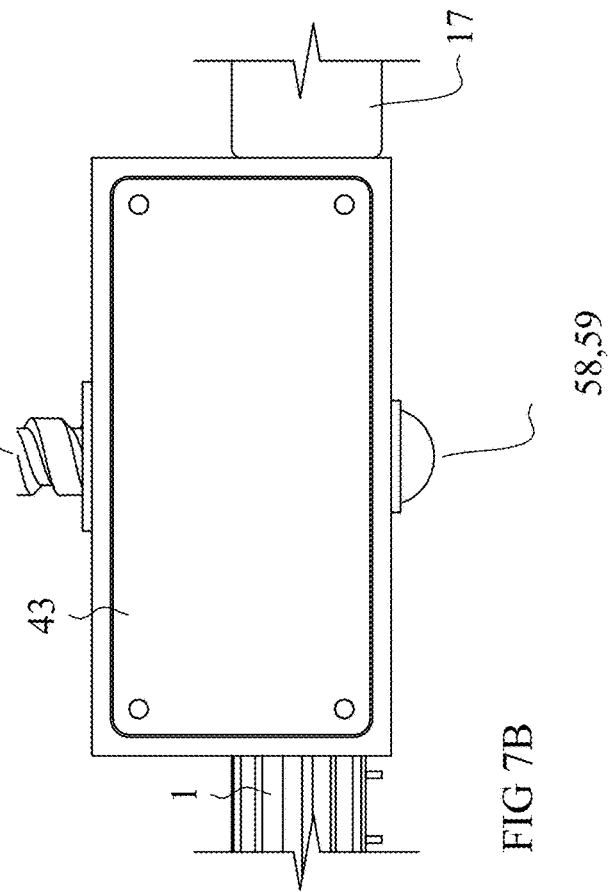
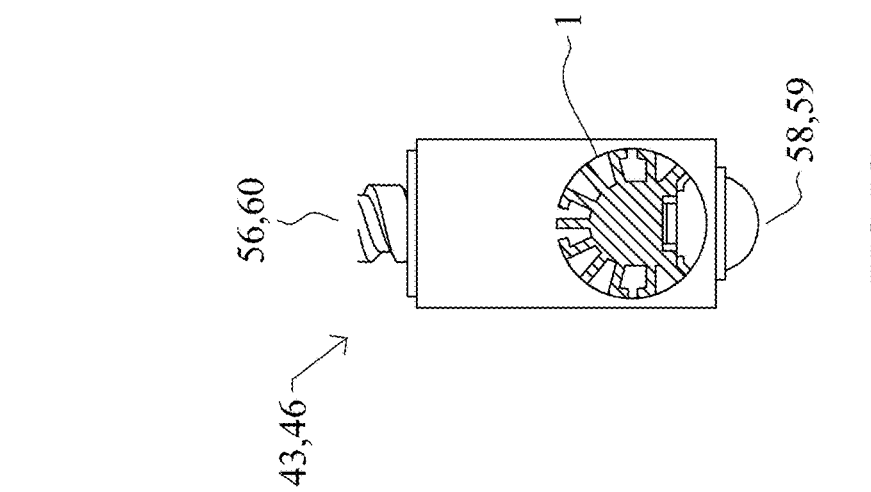
FIG 7A
FIG 7B
FIG 7C

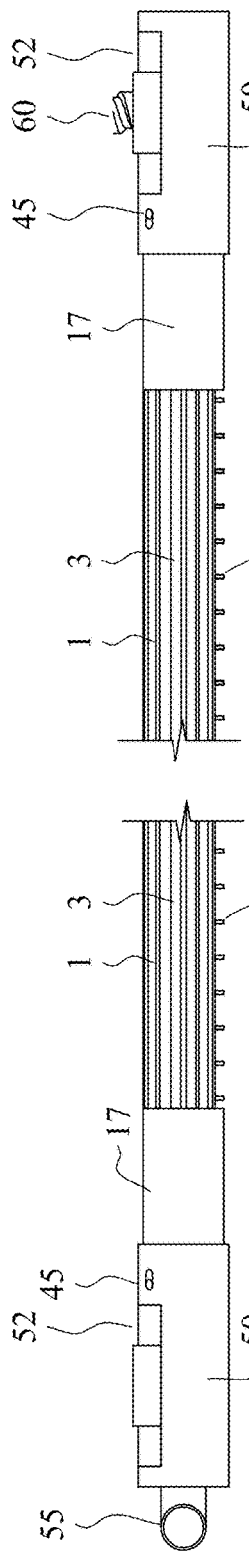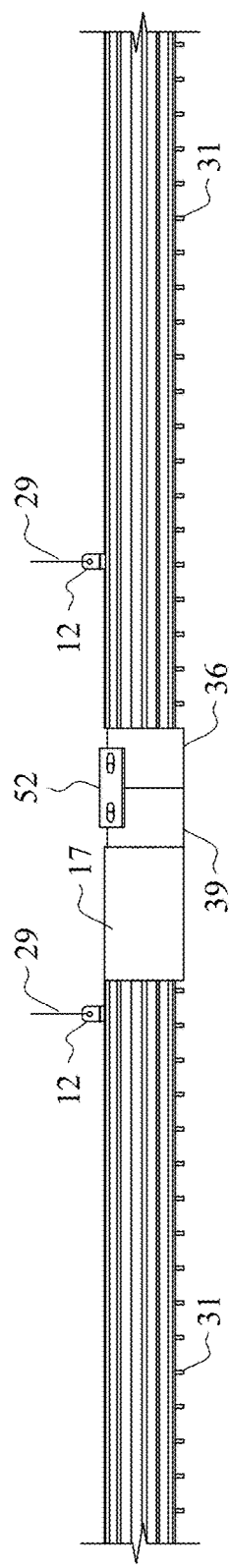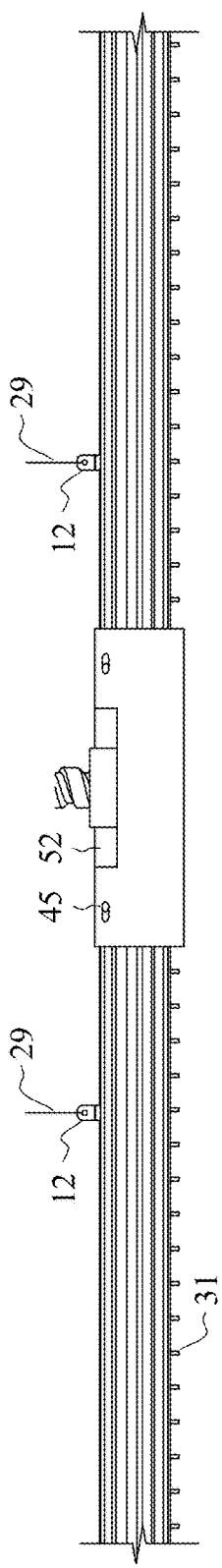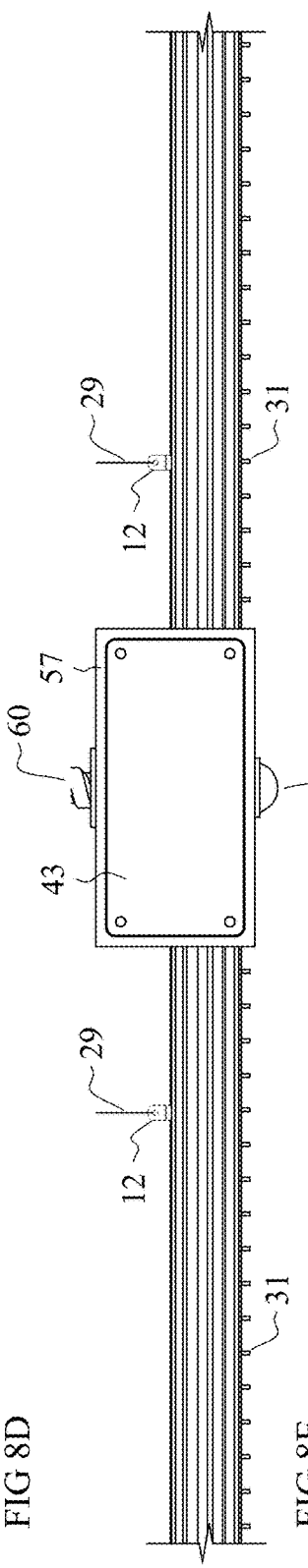
FIG 8C
FIG 8B
FIG 8A
FIG 8D
FIG 8E

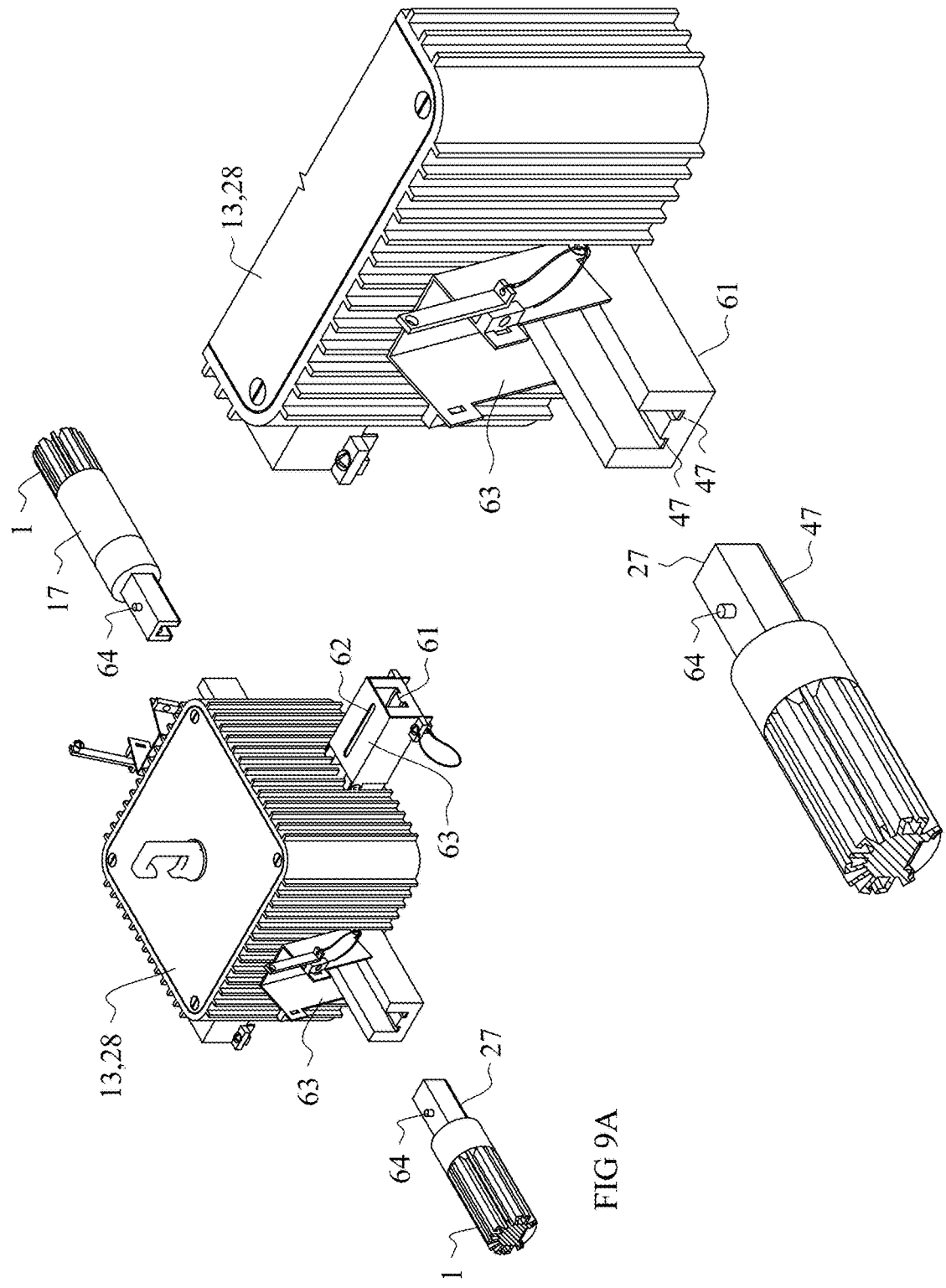

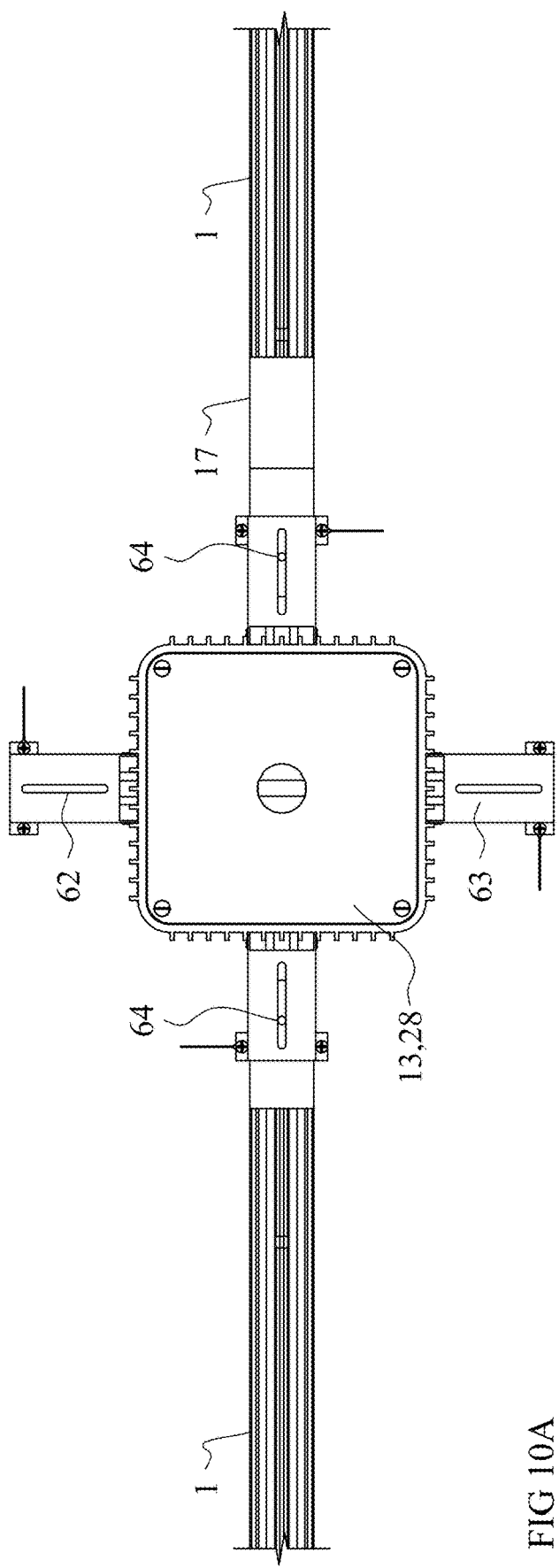
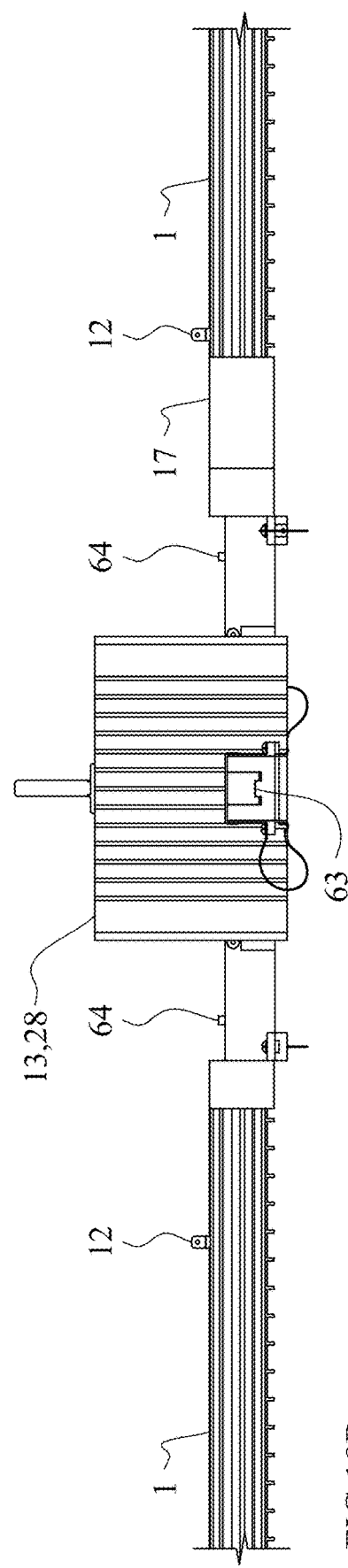
FIG 10A
FIG 10B

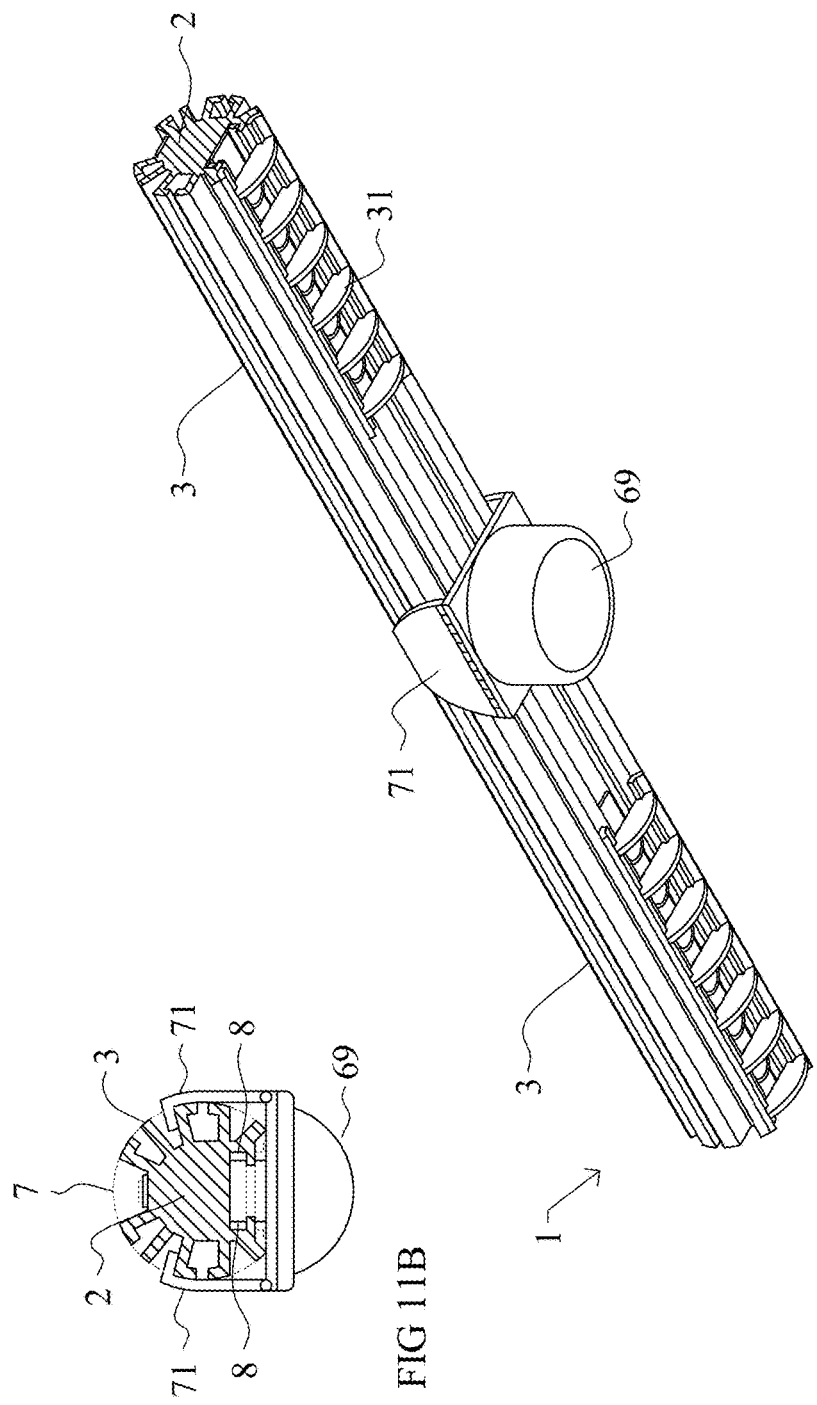
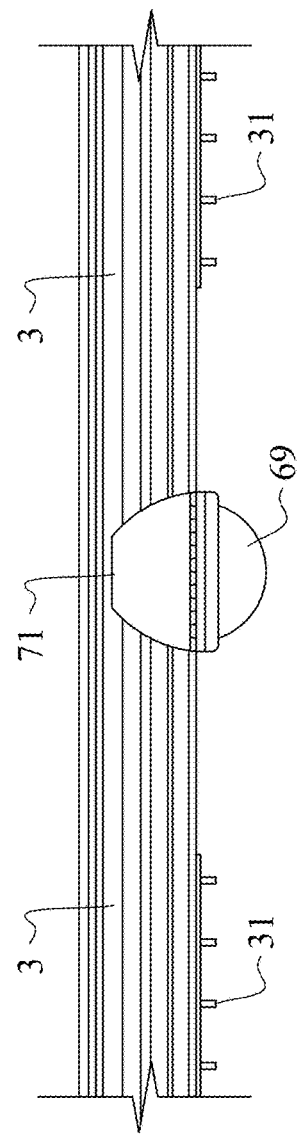
FIG 11B
FIG 11A
FIG 11C

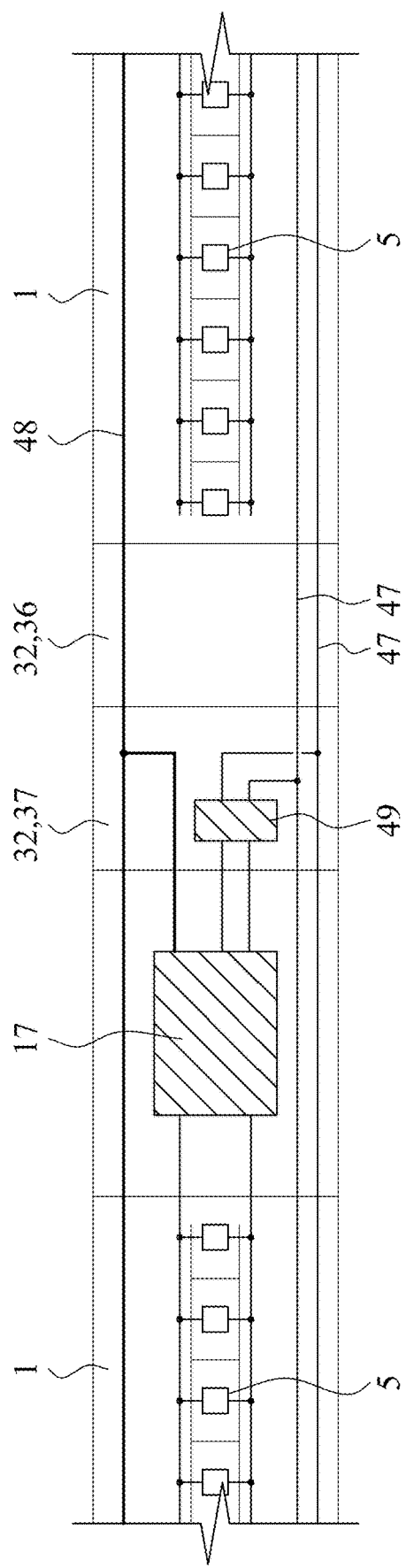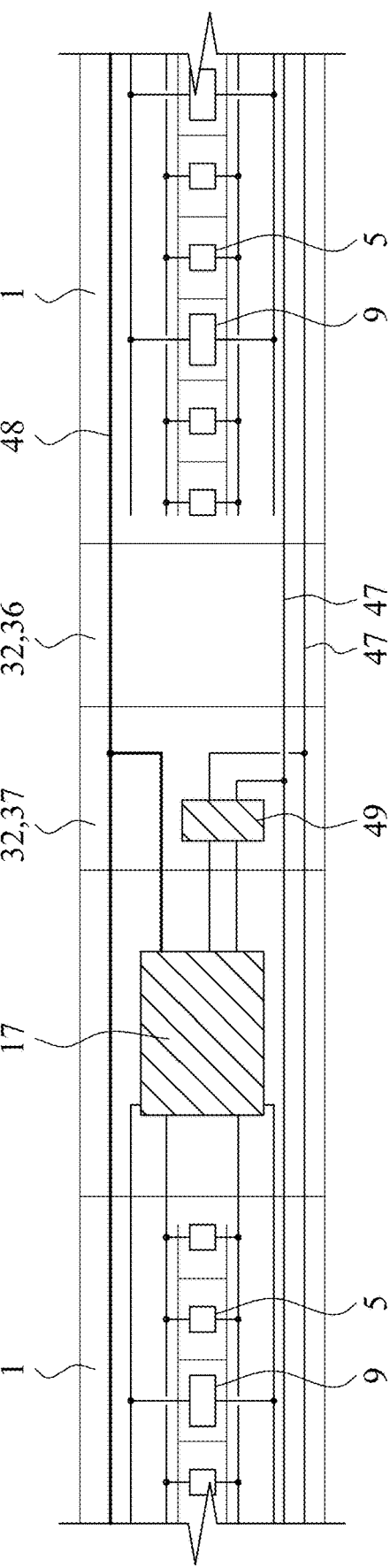
FIG 13A
FIG 13B

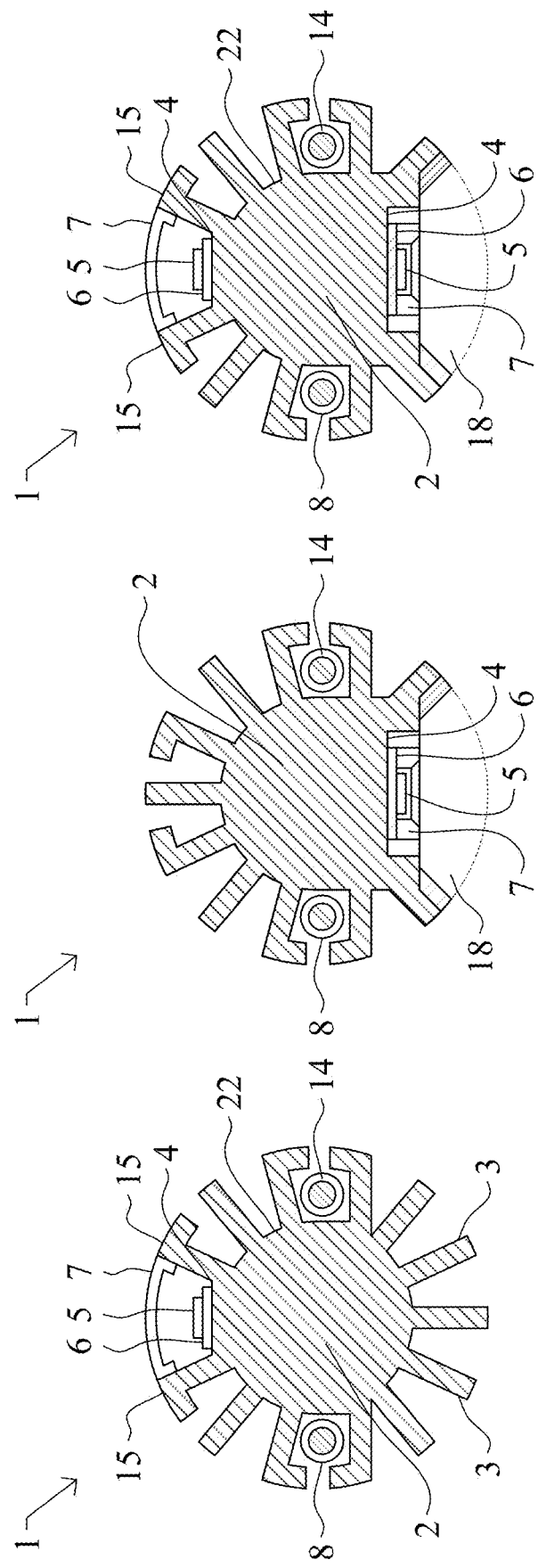

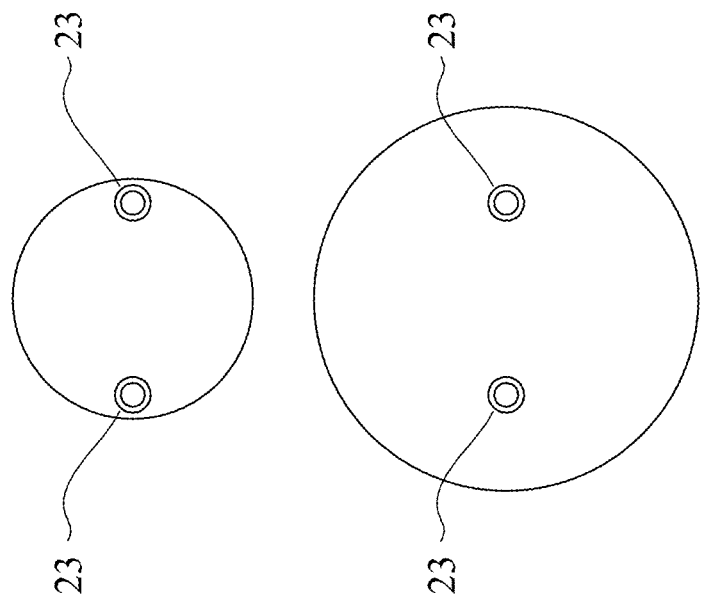
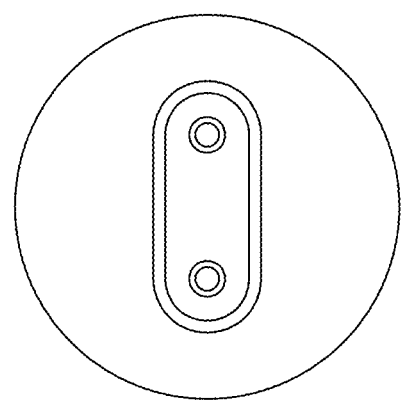
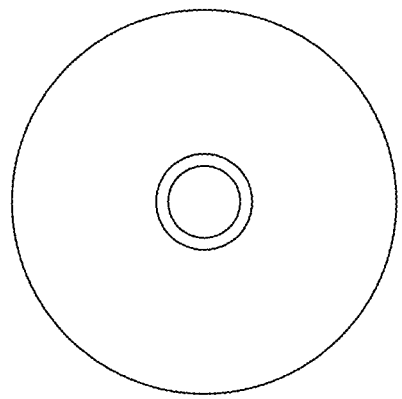
FIG 17C
FIG 17B
FIG 17A

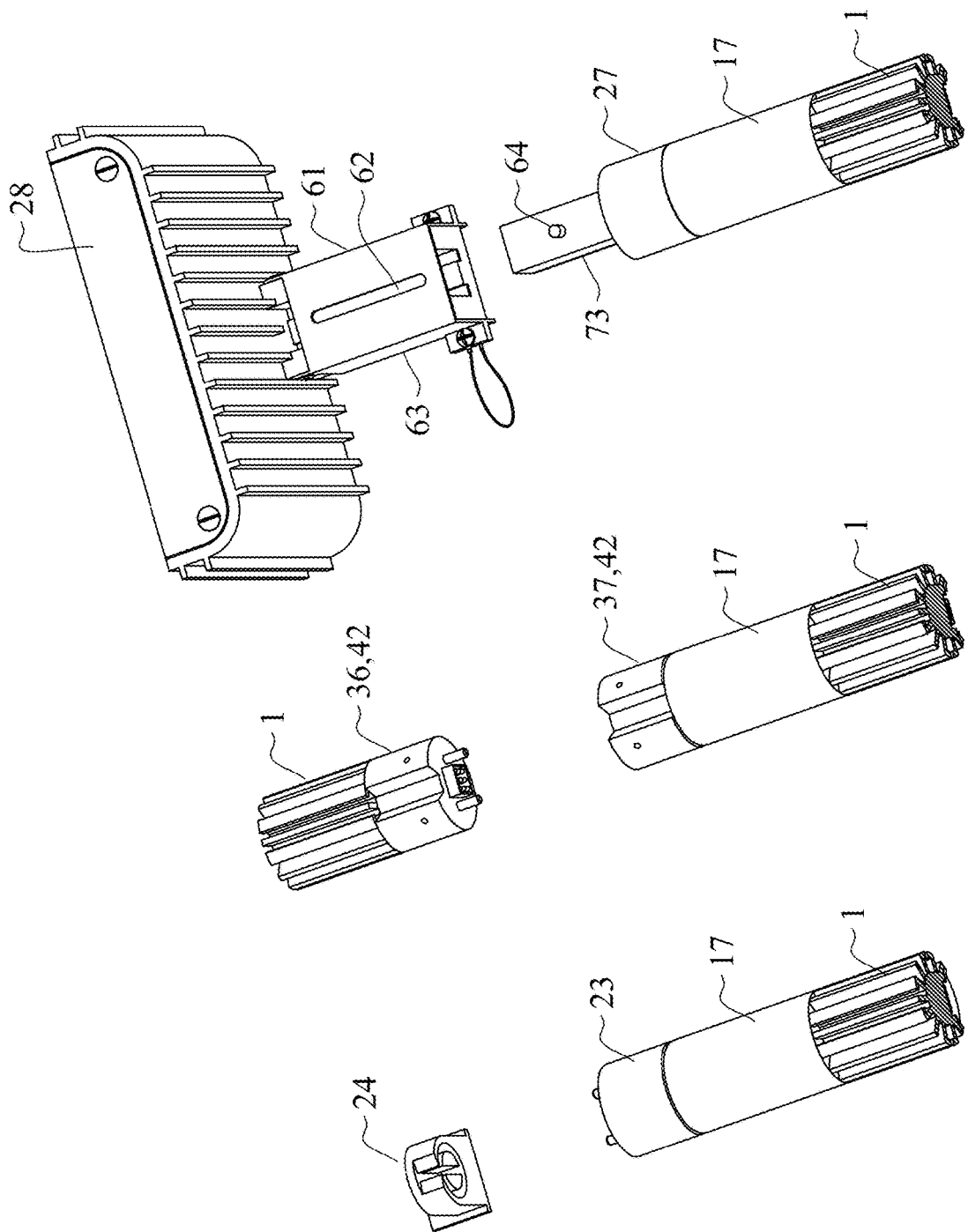

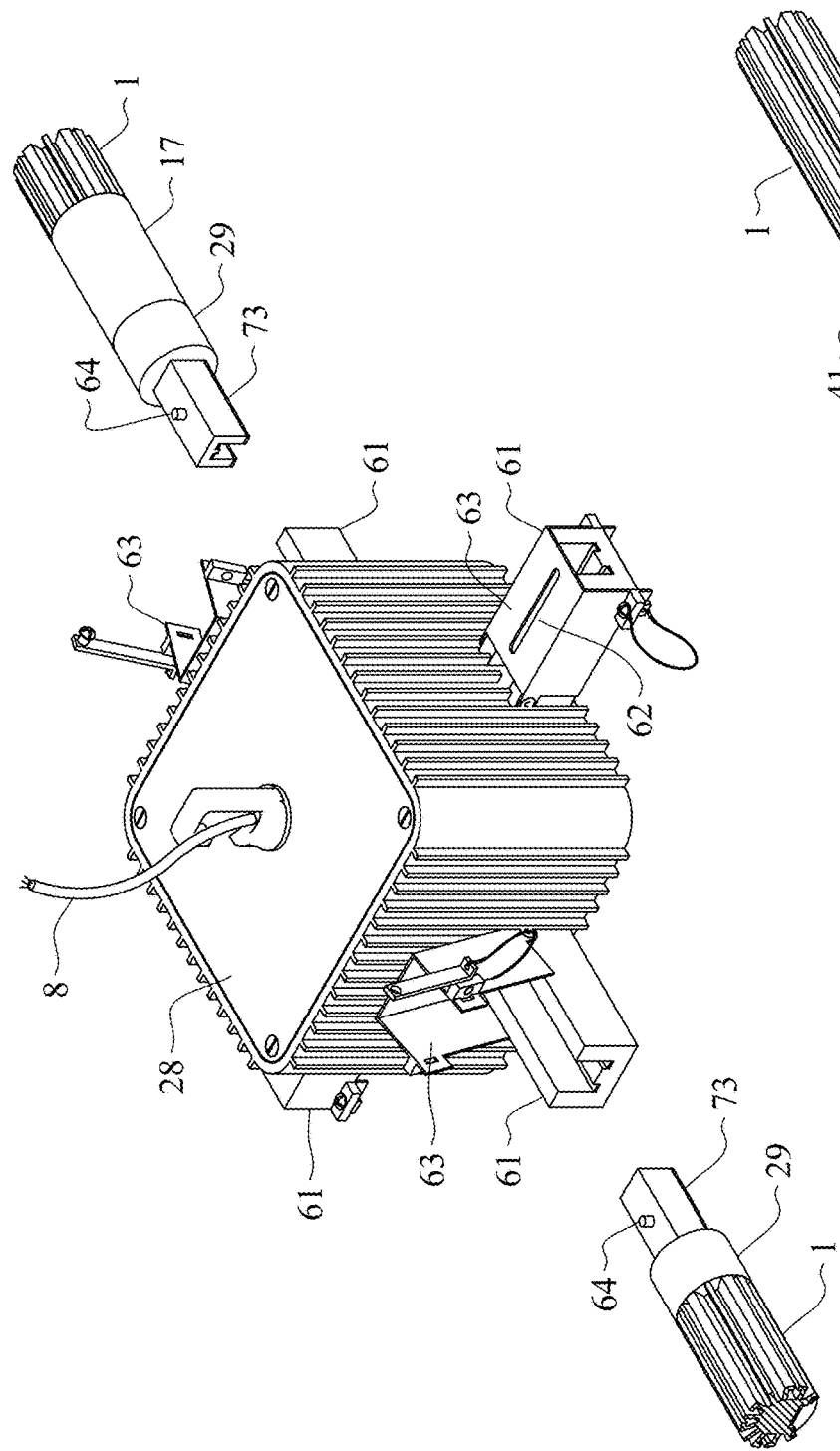
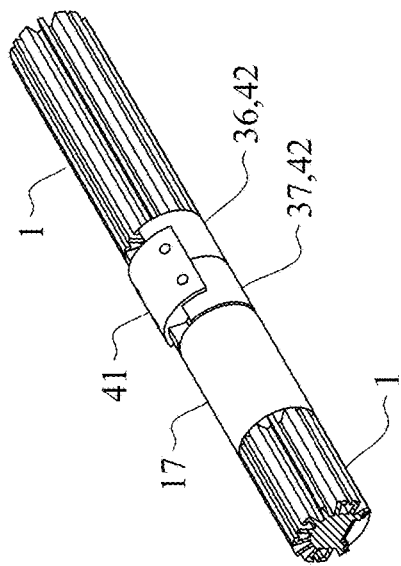
FIG 19B
FIG 19A

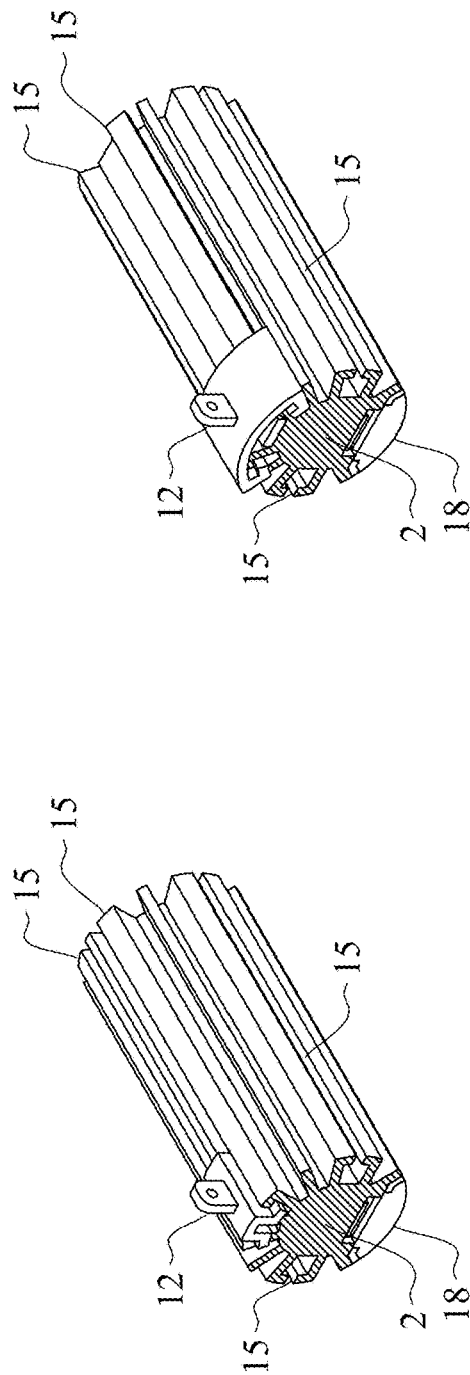
FIG 20C
FIG 20B
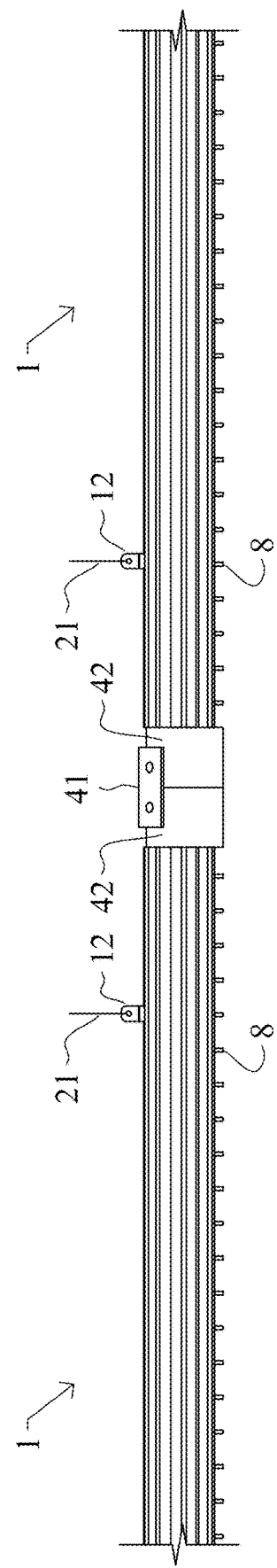
FIG 20A

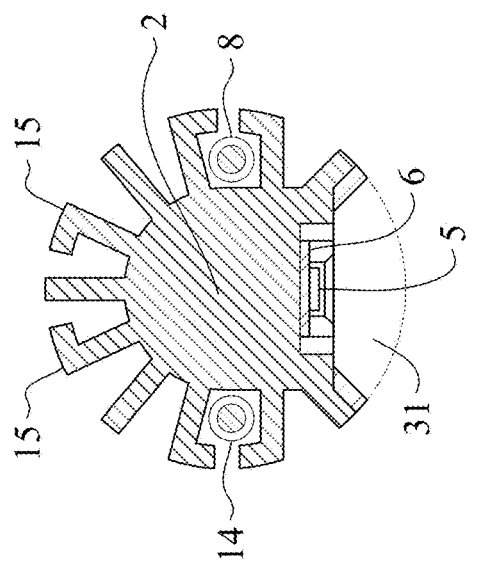
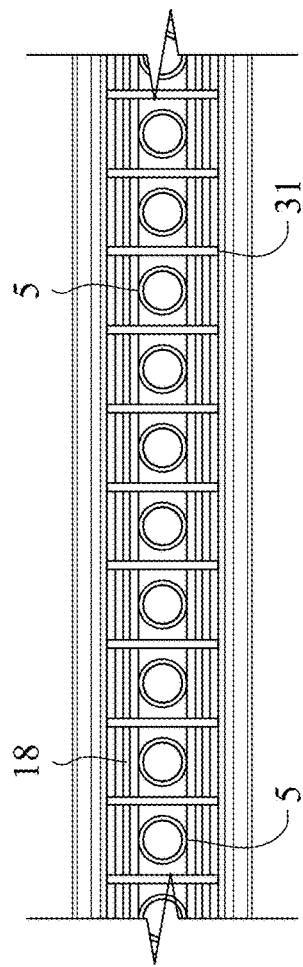
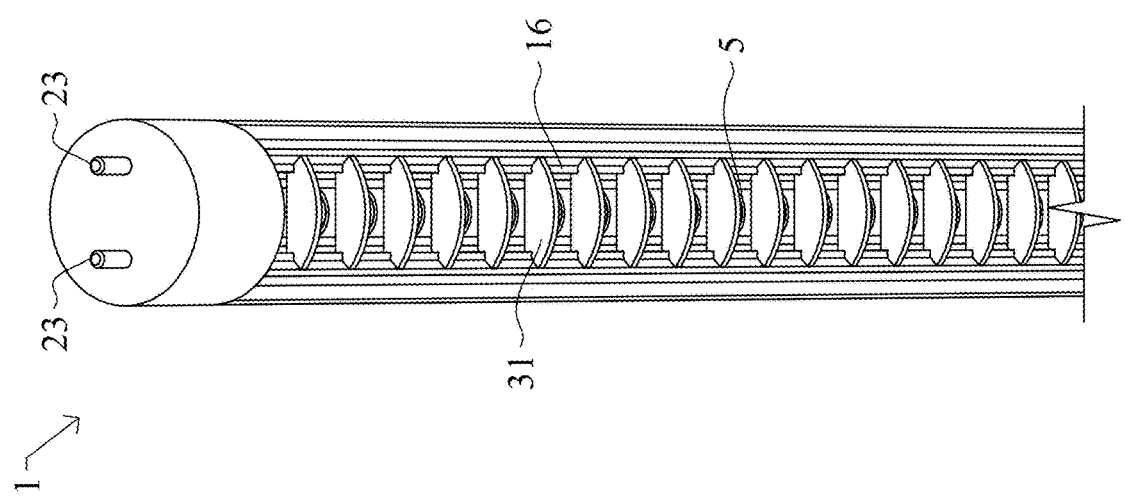
FIG 21B
FIG 21C
FIG 21A

ELONGATED MODULAR HEATSINK WITH COUPLED LIGHT SOURCE LUMINAIRE

CROSS REFERENCE TO RELATED APPLICATION[S]

This application is a continuation-in-part under 35 U.S.C. 365(c) of the earlier International Patent Application entitled "ELONGATED MODULAR HEATSINK WITH COUPLED LIGHT SOURCE LUMINAIRE," international application number PCT/US19/33152, filed May 20, 2019, which claims priority to U.S. Utility patent application entitled "HEAT SINK WITH BI-DIRECTIONAL LED LIGHT SOURCE." Ser. No. 16/019,329, filed Jun. 26, 2018, which claims priority to U.S. Provisional patent application to "HEAT SINK WITH BI-DIRECTIONAL LED LIGHT SOURCE," Ser. No. 62/674,431, filed May 21, 2018, the disclosures of which are hereby incorporated entirely herein by reference.

BACKGROUND OF THE INVENTION

Technical Field

This invention relates generally to a light source and more particularly to an elongated, slimline structure consisting of a monolithically fabricated heatsink core and heat dissipating fins, coupled to a light source wherein the elongated structure substitutes for a light source retained by a luminaire housing.

State of the Art

Today, LED lamp technology is replacing dated fluorescent lamp technology. The replacement takes form by retrofitting existing luminaires and installing new luminaires.

The fluorescent lamp generates light by spanning an electrical arc between the lamp's cathodes. The lamp's cathodes are fixed to the lamp's ends receiving power from the lamp holders. The arc excites the phosphorus coating inside the inner perimeter of the lamp's tube, causing the Phosphorus to glow and emit visible light. The light emitted from the fluorescent lamp radiates evenly at 360 degrees across the lamp' diameter. Fluorescent lamps' output varies at different temperatures. In cold environments, the lamp output diminishes. In warm environments, the lamp output peaks at a specific temperature based on lamp type. Temperatures exceeding this threshold point will contribute to lamp output degradation and premature lamp failure. In spaces where fluorescent luminaires are suspended from the ceiling, manufacturers fabricate an opening directly above the lamp to enable the heat generated to vent up and away. A residual result is upwardly light bleed which architects and interior designers employ as a means to illuminate the ceiling eliminating the visually unpleasant "cave effect".

SUMMARY OF THE INVENTION

Embodiments of the present invention include electrical components and mechanical components of an elongated modular heatsink with coupled light source luminaire. This disclosure addresses each individually.
Electrical The present innovation addresses the heatsink's power or power and communication with their respective means of connectivity.

The heatsink (1) is an elongated structure configured to provide power or power and data to its onboard devices and with some embodiments convey power or power and data to a plurality of coupled heatsinks (1). The heatsink profile may employ several profile configurations. However, common to all are:
1. A core (2) that is substantially or fully solid.
2. Monolithically fabricated core (2) and fins (3) with fins (3) protruding outwardly from the core (2).
3. At least one flat surface (4) on the core (2) that retains light source (5).
4. An elongated linear structure with a maximized length to depth/width ratio.
5. Fins (3) that can be formed to provide utilities in addition to heat dissipation.

The heatsink (1) is a product solution that may replace existing fluorescent luminaires' lamps and may be used in new construction as a low or high-bay luminaire. The heatsink (1) design strips down the fluorescent luminaire embodiment to its bare elements and then reconstitutes the elements' form factor in a minimalistic fashion.

The heatsink's (1) means of electromechanical connectivity is the same as conventional fluorescent lamps', including the connectivity to the lamp holder (24). Today, tubular fluorescent lamps predominantly employ bi-pin electromechanical connectors (23). The present innovation's use of the bi-pin's (23) means of connectivity re-use the existing lamp holder/s (24) placing minimal demands on labor force time, material and level of expertise.

Tubular high output and very high output fluorescent lamps employ a single pin or RDC electromechanical connectors with reciprocating lamp holders (24). Standardizing on bi-pin heatsink connectors (23) shall necessitate RDC and single pin lamp holder change. Regardless of the replaced lamp type means of electromechanical connectivity, the fluorescent lamp's ballast will be replaced with a driver (17). The driver (17) can be integral to the heatsink (1) or located remotely.

Electromechanical heatsink connector (11) types may also include two additional types or a combination thereof. The first type is the plug-in male/female coupler (42,36,37) forming a contiguous heatsink (1) array. Such connectors types are similar to art disclosed in Spiro, et al, U.S. Pat. No. 9,328,882. The second type is referred to herein as a sliding connector (27). This connector is designed to couple to a heatsink J box (28) or an electronic device housing (13). These two connectors types (42,27) may include provisions to convey power or power and data through the heatsink's (1) elongated embodiment from end to end. A through opening/chase (14) extending the length of the heatsink can be formed inside the heatsink's core (2), or by forming at least one fin (3) or a combination thereof. Figures depicted in this application show examples of formed openings by two fins (3), with a venting air gap between.

Returning to the coupler connector (42), the connector at the longitudinal end of the heatsink (1) may vary. At one end, the connector conveys power or power and data to a reciprocating coupler (42) coupled to a downstream heatsink (1). This reciprocating coupler (42) conveys power or power and data through to the heatsink's (1) other end and provides tributary power or power and data to the unitary heatsink electrical devices (9).

The coupler connector (42) on the upstream end may include a power limiter to protect against overloading the heatsink's electrical device (9) capacity. The limiter may be coupled to other devices. These other devices may include at least one of: driver (17), sensing (58), communication and control device/s. Such devices can be integral or remotely mounted on the heatsink. The integral heatsink driver (17) receiving its power from the upstream coupler (37,42) may also receive signal from the data conductor (48). A microprocessor (34) can then control the driver (17) and any other devices coupled.

The driver (17) with control leads on the input side may also have power or power and data leads to lighting and other neighboring device/s. The data input to the driver (17) can also be wireless wherein a transceiver (33) is in communication with the driver (17) and/or other devices. In yet a different embodiment, the driver (17) coupled to the microcontroller and an onboard transceiver (33) can wirelessly communicate with other devices.

Mechanical

The present innovation expands on art described in application Ser. No. 16/019,329 and 62/674,431. This application focuses on structural, thermal management, and optical control of electrical devices coupled to the heatsink. The heatsink is configured to replace T5, T8 and T12 fluorescent lamp embodiments in existing facilities and establishes a novel class of products for new construction. In existing facilities, the heatsink employs electromechanical connectors commonly and widely used by the fluorescent lighting industry. These connectors include but are not limited to bi-pin and RDC receptacles. In replacing an existing fluorescent lamp with the heatsink retaining LED lamp/s, the heatsink can be provided with an integral driver. Otherwise, the driver can replace the luminaire's ballast/s. The driver may also include communication and control feature/s. Such features will be disclosed in more detail under a separate power and data application. The heatsink's electrical and data connectivity for replacement of fluorescent lamps in existing low/high-bay applications is different than employing the heatsink in new construction. With existing fluorescent luminaires, the heatsink's module dimensions and means of connectivity are adapted to conform to industry standards associated with lamp length, diameter, and means of connectivity. By contrast, new construction heatsinks are free to employ different diameter lengths and means of connectivity. For new construction, the heatsink is the luminaire.

The heatsink (1) is a novel product solution that replaces tubular fluorescent lamps in existing applications and offers an alternate low/high-bay luminaire type for new construction. The heatsink's (1) minimalistic design strips down the conventional luminaire elements to their bare essential reconstituting these essential elements in a simple linear elongated heatsink (1) structure. The heatsink (1) design minimizes the use of material, luminaire size and weight while extracting maximum benefit from the selected material's thermal and structural properties.

The heatsink (1) design maximize the embodiment's span while minimizing its profile dimensions. It also maximizes the heatsink's capacity to absorb and then dissipate light source (5) heat. The heatsink (1) may be coupled to electronic or non-electronic devices that add weight to the elongated structure. The elongated body profile dimension selected may factor in the added weight of the external powered and/or non-powered devices. Nonetheless, since the heatsink is suspended by hanger/s (12) or mounted to structure by bracket/s (19), the additional weight can be supported by adding additional mounting points of support. The hanger/s (12) and the bracket/s (19) are free to travel along the length of the embodiment. The hanger (12) or bracket (19) inserted from one end of the heatsink (1) travel along the track hanger opening (40) that can be formed by the heat dissipating fins (3). In addition to overcoming the weight constraint, this mounting method also remedies deflection concerns.

The heatsink's (1) profile's maximum dimension to its overall linear length ratio may vary between existing fluorescent applications and new construction. For fluorescent lamp replacement applications, the heatsink's profile may emulate T8 or T12 fluorescent lamp diameters. For new construction the heatsink's profile depth can be the same as existing fluorescent or different dependent primarily on the length of the span. The heatsink's (1) maximum profile cross-sectional dimension to the heatsink's overall longitudinal length ratio shall be equal to or greater than 1:30. This ratio can increase significantly in new construction that employs longer heatsink (1) sections.

Regardless of the span, the heatsink's thermal dissipation design for its coupled light sources (5) maintains the light source junction temperature (Tc) at or below 85° C. within room ambient temperature design equal to or below 50.1° C.

A light source (5) coupled to at least one flat surface (4) of the heatsink's (1) core (2) conveys most of the light source (5) heat into the heatsink's core (2). From the core (2), the heat travels to the core's (2) exterior surface and the heat dissipating fins (3). The core (2) is partially exposed to free-flowing air and the fins (3) can be fully exposed to free-flowing air.

The light source (5) may retain several types of lenses (7). The lens (7) re-shapes the light source emitted light distribution pattern to optimally shape the distribution pattern's for light uniformity and intensity while minimizing the use of energy. Since the heatsink's applications require medium and high mounting, high output light sources (5) are typically employed. Such light sources (5) could cause visual discomfort due to direct glare. At least in one embodiment herein the heatsink (1) employs a glare mitigating cross baffle (18).

The present innovation bridges between existing application and new construction needs, demonstrating viability for both markets. Streamlining the product concept to its prime design objectives, the heatsink:

1. Can be extruded or molded using a minimal amount of material.
2. Can be of metallic or non-metallic material.
3. Embodiment is lightweight.
4. Display high thermal conductivity value.
5. Embodiment's fins display good heat dissipation value.
6. Manufacturing process is inexpensive.
7. Material cost is inexpensive and readily available worldwide.
8. Material is rigid and resists long span deflection.
9. Material is malleable to form diverse supplemental utility.
10. Material is rugged and can withstand physical abuse.
11. Material is resistant to corrosion.
12. Material can have a long un-supported span significantly reducing labor and material costs.

There are several materials and fabrication methods for the heatsink. For reasons of brevity this application teaches primarily about an extruded heatsink embodiment.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 2A is an end view of a coupler connector of a heatsink, in accordance with an embodiment.

FIG. 2B is a partial bottom view of a coupler connector of a heatsink, in accordance with an embodiment.

FIG. 2C is a partial bottom view of a coupler connector of a heatsink with a driver, in accordance with an embodiment.

FIG. 3A is a perspective view of a male and female keyed coupler connectors of a heatsink, in accordance with an embodiment.

FIG. 3B is a partial top perspective view of two heatsinks coupled together, in accordance with an embodiment.

FIG. 3C is a partial top perspective view of two heatsinks coupled together with an electronic device coupler, in accordance with an embodiment.

FIG. 5A is an end view of an end coupler joiner with side or side and top power or power and data ingress/egress feed, in accordance with an embodiment.

FIG. 5B is a top view of an end coupler joiner with side or side and top power or power and data ingress/egress feed coupled to a heatsink, in accordance with an embodiment.

FIG. 5C is a side view of an end coupler joiner with side or side and top power or power and data ingress/egress feed coupled to a heatsink, in accordance with an embodiment.

FIG. 5D is a perspective view of an end coupler joiner with side or side and top power or power and data ingress/egress feed, in accordance with an embodiment.

FIG. 6A is a perspective view of an intermediate coupler joiner coupled between two heatsinks, in accordance with an embodiment.

FIG. 6B is a top view of an intermediate coupler joiner coupled between two heatsinks, in accordance with an embodiment.

FIG. 6C is a side view of an intermediate coupler joiner coupled between two heatsinks, in accordance with an embodiment.

FIG. 7A is an end view of a coupler hub/electronic device coupler coupled between two heatsinks, in accordance with an embodiment.

FIG. 7B is a top view of a coupler hub/electronic device coupler coupled between two heatsinks, in accordance with an embodiment.

FIG. 7C is a side view of a coupler hub/electronic device coupler coupled between two heatsinks, in accordance with an embodiment.

FIG. 8A is a side view depicting connectivity between two heatsinks, in accordance with an embodiment.

FIG. 8B is a side view depicting an end coupler joiner coupled to a heatsink with power or power and data feed from above, in accordance with an embodiment.

FIG. 8C is a side view depicting an end coupler joiner coupled to a heatsink with power or power and data feed from the side, in accordance with an embodiment.

FIG. 8D is a side view depicting an intermediate coupler joiner with power or power and data feed from above, coupled between heatsinks from both ends, in accordance with an embodiment.

FIG. 8E is a side view depicting a coupler hub with power or power and data feed from above, a sensing device mounted to the bottom of the hub and heatsinks coupled to both ends, in accordance with an embodiment.

FIG. 9A is a perspective view of a heatsink sliding connector J box, in accordance with an embodiment.

FIG. 9B is a zoomed in, partial perspective view of a heatsink sliding connector J box, in accordance with an embodiment.

FIG. 10A is a top view of a heatsink sliding connector J box, in accordance with an embodiment.

FIG. 10B is a side view of a heatsink sliding connector J box, in accordance with an embodiment.

FIG. 11A is an end view of an external electronic device powered by a heatsink, in accordance with an embodiment.

FIG. 11B is a perspective view of an external electronic device powered by a heatsink, in accordance with an embodiment.

FIG. 11C is a side view of an external electronic device powered by a heatsink, in accordance with an embodiment.

FIGS. 13A and 13B are schematic views of power and data circuitry diagrams for electrical devices coupled to a heatsink, in accordance with embodiments.

FIG. 16A is a cross-section view of a heatsink with a light source coupled to a flat surface on a top side of a core of the heatsink, in accordance with an embodiment.

FIG. 16B is a cross-section view of a heatsink with a light source coupled to a flat surface on a bottom side of a core of the heatsink, in accordance with an embodiment.

FIG. 16C is a cross-section view of a heatsink with a light source coupled to a flat surface on a top and bottom side of a core of the heatsink, in accordance with an embodiment.

FIG. 17A is an end view of a single pin conventional fluorescent lamp means of electromechanical connectivity, in accordance with an embodiment.

FIG. 17B is an end view of an RDC conventional fluorescent lamp means of electromechanical connectivity, in accordance with an embodiment.

FIG. 17C is an end view of a bi-pin conventional fluorescent lamp means of electromechanical connectivity, in accordance with an embodiment.

FIG. 18A is a partial perspective view of a bi-pin connector with an integral driver and corresponding lamp holder, in accordance with an embodiment.

FIG. 18B is a partial perspective view of a coupler connector with an integral driver and corresponding lamp holder, in accordance with an embodiment.

FIG. 18C is a partial perspective view of a sliding connector with an integral driver and corresponding lamp holder, in accordance with an embodiment.

FIG. 19A is a perspective view of two heat sinks and J box for coupling using a keyed sliding connector, in accordance with an embodiment.

FIG. 19B is a perspective view of two heat sinks coupled together is coupler connectors, in accordance with an embodiment.

FIG. 20A is a side view of two heatsinks coupled together with hangers to suspending the heatsinks from a ceiling, in accordance with an embodiment.

FIG. 20B is a perspective view of a heatsink with a narrow heatsink hanger, in accordance with an embodiment.

FIG. 20C is a perspective of a heatsink with a wide heatsink hanger, in accordance with an embodiment.

FIG. 21A is a perspective view of a glare mitigating device coupled to a heatsink, in accordance with an embodiment.

FIG. 21B is a glare mitigating device coupled to a heatsink, in accordance with an embodiment.

FIG. 21C is a glare mitigating device coupled to a heatsink, in accordance with an embodiment.

DETAILED DESCRIPTION OF EMBODIMENTS OF THE INVENTION

Embodiments of the present invention include electrical components, depicted in FIGS. 1-13, and mechanical components, depicted in FIGS. 14-21, of an elongated modular heatsink with coupled light source luminaire. This disclosure addresses each individually.

Electrical

Figure 1B:
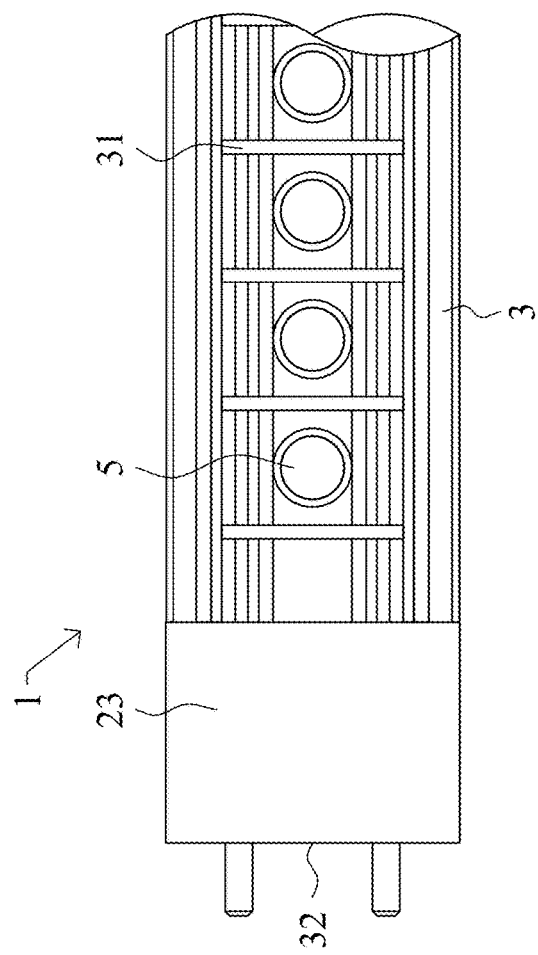
FIG. 1B is partial bottom view of a conventional fluorescent bi-pin electromechanical connector adapted to couple with a heatsink, in accordance with an embodiment.
Figure 1A:
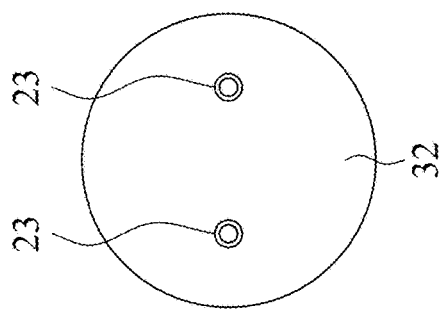
FIG. 1A is an end view of a conventional fluorescent bi-pin electromechanical connector adapted to couple with a heatsink, in accordance with an embodiment.
Figure 1C:
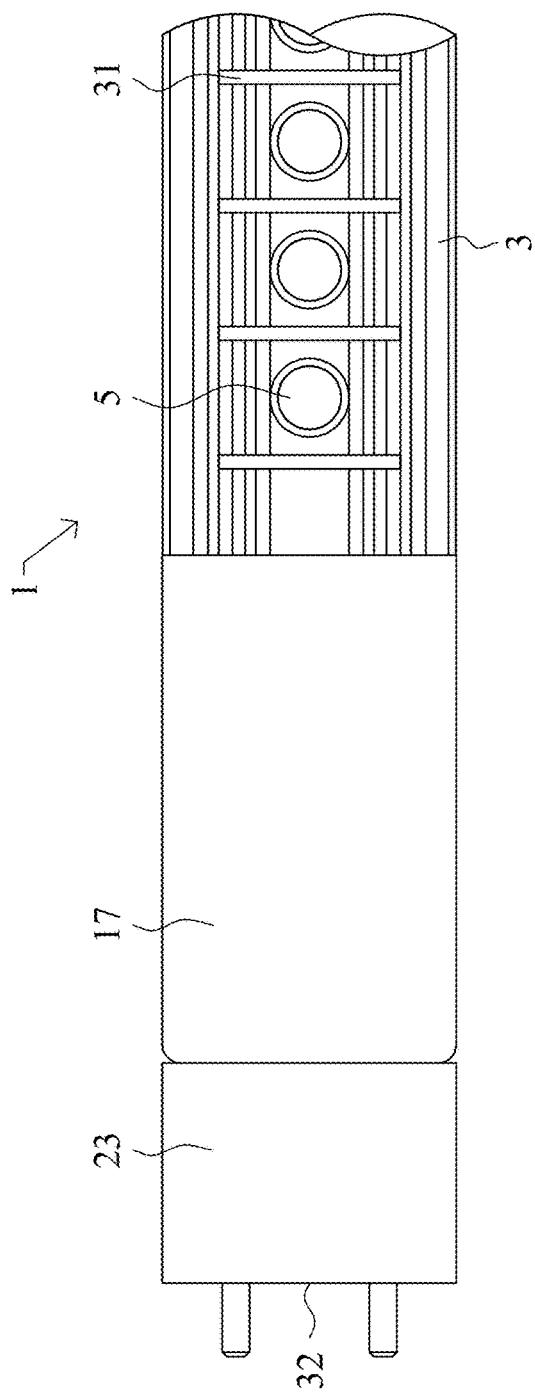
FIG. 1C is a partial bottom view of a conventional fluorescent bi-pin electromechanical connector with a driver adapted to couple with a heatsink, in accordance with an embodiment.

FIGS. 1A, 1B, and 1C show elevation views of an extruded heatsink employing a bi-pin conventional tubular fluorescent electro-mechanical connector.

FIG. 1A shows the elongated heatsink embodiment's short end with a bi-pin connector (23). The connector (23) is coupled to the heatsink (1) at both ends. The bi-pin dimensions at least in one embodiment are the same as the conventional fluorescent connector dimensions for the purpose of replacing fluorescent lamp with the heatsink light emitting embodiment. The bi-pin pin material also can be the same as the conventional fluorescent connector. The bi-pin connector is seated in the lamp holder by inserting and rotating the linear embodiment so that its light source center is typically perpendicular to the plane it's tasked to illuminate.

FIG. 1B shows a partial bottom elevation of the bi-pin heatsink electromechanical connector. Elements shown include: The bi-pin connectors (23), the connector end cap (32), fin (3), light source (5), lens (7) and cross baffle (18).

FIG. 1C shows the heatsink's (1) bi-pin connector (23) coupled to the driver (17). The driver (17) in turn is coupled to the heatsink (1). This embodiment employs an integral driver (17) freeing the heatsink assembly from a dependency on an electronic device housing (13) to retain the driver. The integral driver (17) may provide additional functionality including power, or power and data connectivity to at least one of: communication, control, and/or sensing device/s. Such device/s can be internal, coupled or remotely located to said driver (17).

Since the heatsink in at least one embodiment will be employed in existing environments where control infrastructure may not exist, the driver (17) may be coupled to a transceiver (33) and communicate wirelessly. An onboard processor (34) with a microswitch operating a locally stored program can switch on/off and dim the heatsink's input/output devices. The processor can be coupled to the driver or in the driver's vicinity.

Elements shown include: The bi-pin connector (23), the connector end cap (32), fin (3), light source (5), lens (7), cross baffle (18) and a driver (17).

FIGS. 2A, 2B, and 2C show elevation views of an extruded heatsink employing a coupler connector (42) for electro-mechanical connectivity.

FIG. 2A shows the elongated heatsink's embodiment short-end male coupler connector (36) elevation. The coupler connector enables direct heatsink to heatsink (1) electro-mechanical connectivity mating the male coupler connector (36) with a reciprocating female coupler connector (37). Power or power and data flow between the connectors conveying power or power and data connectivity between the plurality of heatsinks (1).

Elements shown include: pin projection (38), data port projection (39), hanger fin (15) and track hanger opening (40).

The coupler is made of non-conductive insulator material and can be secured to a reciprocating coupler by a coupler joiner (41) (not shown) preventing lateral separation.

FIG. 2B shows a partial bottom elevation of the coupler connector (42) electro-mechanical connector. Elements shown include: data port projection (39), pin projection (38), hub (43), fin (3), light source (5), lens (7) and cross baffle (18).

FIG. 2C shows the heatsink's coupler connector (42) coupled to a driver (17), the integral driver coupled to the heatsink (1). This embodiment employs an integral driver (17) freeing the heatsink assembly from a dependency on an electronic device housing (13) to retain the driver. The integral driver may provide additional functionality including power or power and data connectivity to at least one of: communication, control, and/or sensing device/s. Such device/s can be internal, coupled or remotely located to said driver (17).

Elements shown include pin projection (38), data port projection (39), coupler hub (43), light source (5), lens (7), fin (3) and cross baffle (18). The coupler connector (42) facilitates continuous electrical or electrical and wired data connectivity between heatsink embodiments. It can secure one coupler to another with a coupler joiner (41) (not shown). The heatsinks' coupled array weight is typically carried by hanger/s (12) and/or bracket/s (19). Both mounting devices are coupled to the heatsink's (1) hanger fin/s (15) (not shown).

FIGS. 3A, 3B, and 3C show partial perspectives of the coupler connector (42) assembly.

FIG. 3A shows perspectives of the male coupler connector (36) and the female coupler connector (37). The female coupler connector (37) is typically coupled to the heatsink (1) at the upstream side of the power feed while the male coupler connector (36) is at the downstream side. Both coupler types are configured to be factory fabricated to the heatsink (1) ready to be field installed. The coupler is fabricated of an electrically insulating material wherein the internal power or power and data distribution elements can be encased in the insulation material simultaneously at the time when the coupler is fabricated. Similarly, electronic devices such as a current limiter can be embedded with the coupler. On the top face of the coupler connector (42) a "U" shaped coupler joiner groove (44) is aligned with the hanger fin/s (15). The groove's legs open outwardly to retain a coupler joiner (41) (not shown).

Other elements shown include: The coupler's hub (43) and coupler joiner threaded bore (45).

FIG. 3B shows a partial top perspective view of two coupled heatsinks (1). In this embodiment one of the heatsinks is coupled to a driver (17). The driver (17) has an integral coupler joiner (41) with a reciprocating key to engage the coupler joiner (41) of the coupled heatsinks (1). Other elements shown include: fin/s (3), lens (7), light source (5), aircraft cable (29) and hanger (12).

FIG. 3C shows a top perspective view of two heatsinks (1) coupled to an electronic device coupler (46) from both ends. The device's power or power and communication is received from its one of the coupled heatsinks (1). The device can generate input, output, or a combination of both thereof. The device may operate in conjunction with a plurality of locally mounted devices. In another embodiment, the device may power and/or control other integrated devices. In some embodiments the electronic device coupler (46) has no electronic devices only retaining power or power and data conductors. In such embodiments the electronic device coupler (46) acts only as an extender chase. The electronic device coupler (46) may also have means to mount a hanger (12) or a bracket (19) and a coupler joiner groove (44) to couple it to the heatsink (1).

Elements shown include heatsink (1), coupler hub (43), electronic device coupler (46), coupler joiner (41), fin/s (3), lens (7) and light source (5).

Figure 4B:
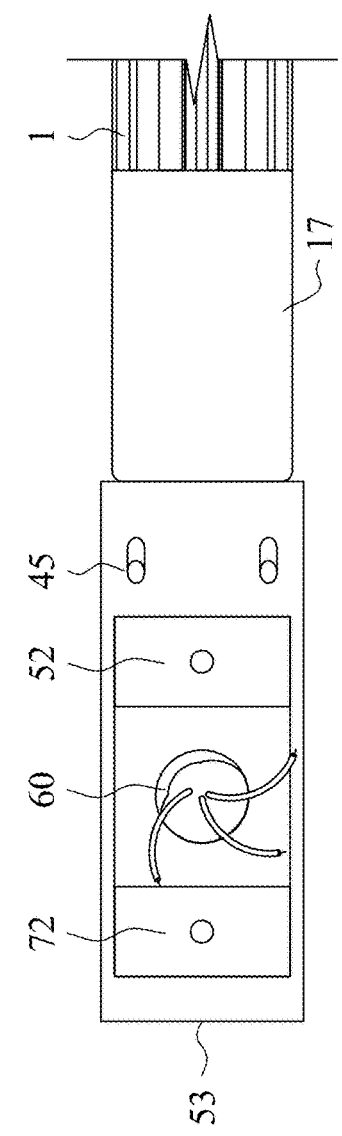
FIG. 4B is a top view of a coupler joiner with top power or power and data feed coupled to a heatsink, in accordance with an embodiment.
Figure 4C:
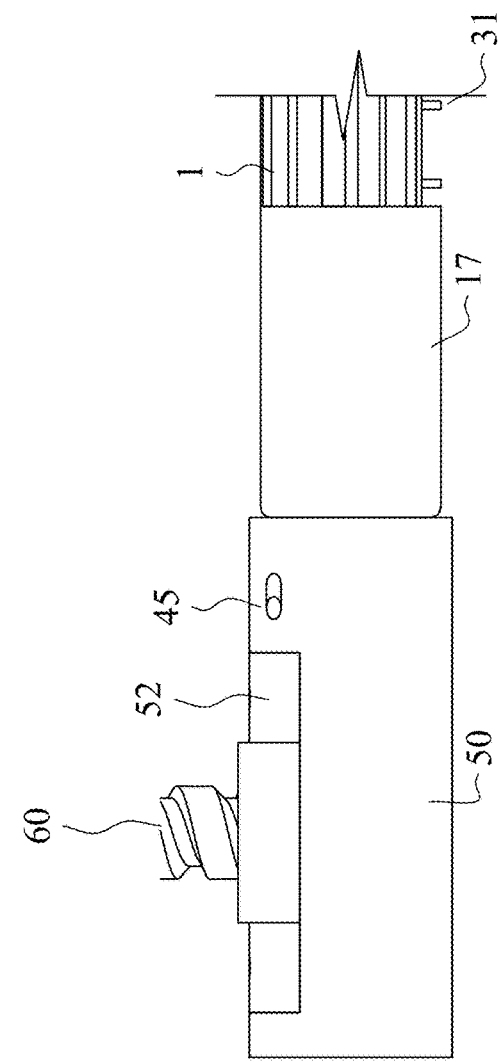
FIG. 4C is a side view of a coupler joiner with top power or power and data feed coupled to a heatsink, in accordance with an embodiment.
Figure 4A:
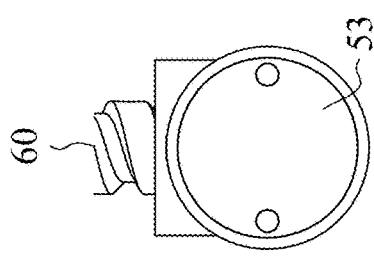
FIG. 4A is an end view of a coupler joiner with top power or power and data feed, in accordance with an embodiment.
Figure 4D:
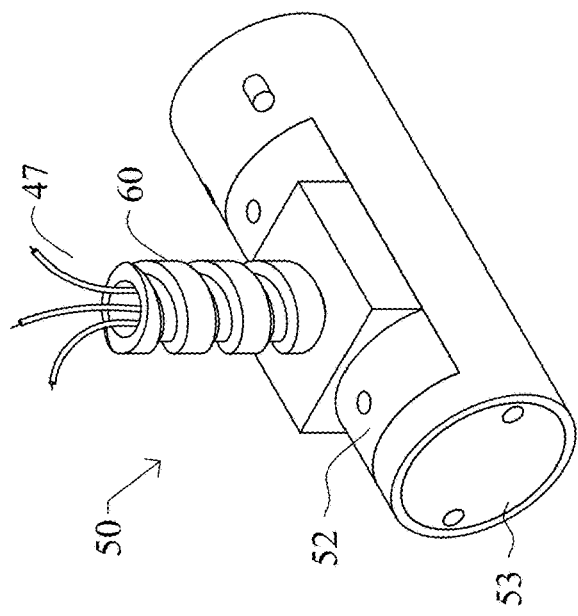
FIG. 4D is a perspective view of a coupler joiner with top power or power and data feed, in accordance with an embodiment.

FIGS. 4A, 4B and 4C show elevations of the end coupler joiner (50). FIG. 4D shows the coupler's perspective.

FIG. 4A shows the end coupler joiner (50) end view. The end coupler joiner (50) can be top fed or side fed. In this example, power enters the end coupler joiner (50) through a conduit (60) from above. At the coupler's end a removable enclosure plate (53) encloses a volumetric void inside the end coupler joiner (50). When power is fed from the coupler's end, the enclosure plate (53) is removed and splicing connections are made before coupling a J box to the end coupler joiner (50). The power and/or the data conduit is attached to the coupler joiner cover (52). This removable coupler joiner cover (52) covers the coupler's internal void space (not shown). That space is used to splice incoming or outgoing power or power and data conduit/s (60).

FIG. 4B shows the top view of the end coupler joiner (50). Elements shown include: conduit/s (60), coupler joiner cover (52), and a partial view of a heatsink (1) engaging the end coupler joiner (50).

FIG. 4C shows a side view of the end coupler joiner (50). Elements shown include: conduit/s (60), coupler joiner cover (52) and a partial view of a heatsink (1) engaging the end coupler joiner (50).

FIG. 4D is a perspective view of the end coupler joiner (50). Elements shown include: conduit/s (60), coupler joiner cover (52) and the coupler joiner's connector receptacle (54).

FIGS. 5A, 5B, and 5C show elevations of the end coupler joiner (50). FIG. 5D shows the coupler's perspective.

FIG. 5A shows the end coupler joiner (50) end view. In this embodiment, a power or power and data conveying fitting (55) is coupled to the end coupler joiner (50) end side. When side feed is used, the enclosure plate (53) is removed so such fitting (55) can be coupled. The end coupler joiner (50) can also act as a miniaturized power or power and data distribution box. The joiner can receive and deliver power or power and data to other electronic devices employing the side feed connection or both the side feed and the top feed. Elements shown include the fitting (55) and the end coupler joiner (50).

FIG. 5B shows the top view of the end coupler joiner (50). Elements shown include: conductor/s port (56), coupler joiner cover (52), a partial view of a heatsink (1) engaging the coupler joiner (50) and the power conveying fitting (55).

FIG. 5C shows the side view of the end coupler joiner (50). Elements shown include: conductor/s port (56), coupler joiner cover (52) a partial view of a heatsink (1) engaging the coupler joiner (50) and the power conveying fitting (55).

FIG. 6A shows a perspective view of the intermediate coupler joiner (51). FIGS. 6B and 6C show the joiner's top and side views respectively.

FIG. 6A shows top and side perspectives of the joiner (51) with two heatsinks (1) engaged at both ends of the joiner (51). The joiner's connector receptacle (54) can be keyed to accept a male coupler connector (36) on one end and a female coupler connector (37) on the other end. They also can have same type connector on both ends. The intermediate coupler joiner (51) is used where power or power and wired communication conductors are placed perpendicular to the long array of coupled heatsinks (1). Feeding power or power and data from a midpoint can reduce voltage drop and reduce wire gauge. Elements shown include: conductor/s (8), heatsink (1) and coupler joiner cover (52).

FIG. 6B shows the top view of the intermediate coupler joiner (51) Elements shown include: conductors (8), coupler joiner cover (52) and a partial view of two heatsinks (1) engaging the joiner (51) from both ends.

FIG. 6C shows the side view of the intermediate coupler joiner (51). Elements shown include: conductors (8), coupler joiner cover (52) and a partial view of two heatsinks (1) engaging the joiner (51) from both ends.

FIGS. 7A, 7B and 7C show elevations of the coupler hub (43). The coupler hub (43) enhances the capabilities of the end coupler joiner (5) and the intermediate coupler joiner (51). The hub (43) can include at least one electronic device. The electronic device can be inside the coupler hub (43), coupled to the hub's exterior, or a combination of a plurality of devices thereof.

FIG. 7A shows a side view of the coupler hub (43) with a sensor (58) or a camera (59) mounted at its bottom. A removable hub door (57) provides access into the hub's enclosure. At least one sensing, processing, memorizing, controlling and/or communication device/s that operate the heatsink's (1) device array can be housed inside the hub (43).

Devices housed inside the coupler hub (43) and/or on it may also communicate, control, and operate in conjunction with remote devices, some of which unrelated to the heatsink's (1) array (not shown).

The coupler hub (43) may house at least one power supply, back-up power, invertor, surge suppressor, and current limiting device. It also may have a provision for circuitry selection and/or switching (not shown). Elements shown include: conductors (8) and a partial view of two heatsinks (1) engaging the hub (43) from both ends.

FIG. 7B shows the top view of the coupler hub (43). Elements shown include: conductors (8) coupled to the conductor port (56) and a partial view of two heatsinks (1) engaging the coupler hub (43) from both ends.

FIG. 7C shows a section through the heatsink (1) with a view toward the side elevation of the hub (43).

Elements shown include a sensor (58) and/or a camera (59) coupled to the bottom of the coupler hub (43), conduits (60) coupled to the conductor port (56. The coupler hub (43) dimensions can vary and depend on the form factor of the devices to be placed in its interior or on it.

FIGS. 8A, 8B, 8C, 8D, and 8E show elevations of the heatsink's (1) coupler means of connectivity:

FIG. 8A shows connectivity between two heatsinks (1) sections.

FIG. 8B shows end coupler joiner (50) coupled to a heatsink (1) with power or power and data feed from above.

FIG. 8C shows end coupler joiner (50) coupled to a heatsink (1) with power or power and data feed from the side.

FIG. 8D shows an intermediate coupler joiner (51) with power or power and data feed from above, coupled to heatsinks (1) from both ends.

FIG. 8E shows a coupler hub (43) with power or power and data feed from above, a sensing device mounted to the bottom of the coupler hub (43) and heatsinks (1) coupled from both sides.

FIGS. 9A and 9B show perspectives of a heatsink sliding connector J box (28). This J box (28) retains at least one heatsink (1) with a reciprocating connector which enables lateral heatsink (1) mobility without disrupting the embodiment's power or power and data connectivity.

FIG. 9A shows the J box (28) mounted to a rigid conduit (60) with four sliding connector receptacles (61) positioned at 90° to one another along the exterior wall of the J box (28). From the opposite side of the J box (28) heatsinks (1) are partially shown in proximity to the sliding connector receptacles (61). At the end of the heatsink a keyed sliding connector (27) receives or receives and conveys power or power and data from the J box (28). In another embodiment, the J box (28) can be coupled to an electronic device housing (13) (not shown) having at least one electronic device inside the housing, coupled to it, on its exterior, or a combination thereof. Yet in another embodiment, the J box (28) and the electronic device housing (13) is one and the same, and the sliding connector receptacle (61) is coupled or integral to said housing.

FIG. 9B shows a perspective of an exemplar embodiment of the keyed sliding connector (27) connection to the sliding connector receptacle (61).

In this embodiment, a slotted opening (62) on the sliding connector receptacle cover (63) reciprocates with a vertical pin (64) mounted on top of the keyed sliding connector (27). When the connector is secured in position, the pin (64) travels laterally removing any mechanical stress from the assembly due to the heatsink's (1) thermal expansion.

While engaged, the keyed sliding connector (27) is configured to maintain power or power and data connectivity when the sliding connector receptacle cover (63) is in its closed and secured position.

FIGS. 10A and 10B show a bottom view and a side view of an electronic device housing (13) with the sliding connector receptacle (61) coupled to it on four sides.

FIG. 10A shows a bottom view of the assembly with a bottom-mounted device such as a sensor (58) or a camera (59) with heatsink (1) coupled to the electronic device housing (13) from opposite sides. Two sliding connector receptacles (61) are shown vacant.

FIG. 10B shows an elevation view of the electronic device housing (13) with power or power and data conduit (60) mounted above, a sensor (58) or a camera (59) mounted below, and two heatsinks engaged at the opposite sides of the housing (13).

The heatsink (1) embodiments are suspended from the ceiling by aircraft cable or chain. The cable or chain is attached to a hangar (12). Heatsinks (1) can also be mounted to above structure by brackets (19). Both the hangars (12) and the brackets (19) can travel laterally along the length of the heatsink's embodiment.

FIG. 11A shows a section through the heatsink, FIG. 11B shows a perspective of the heatsink from below and FIG. 11C shows a side elevation of the heatsink. All views show an external electronic device coupled to the heatsink.

FIG. 11A shows a transverse section through the heatsink (1). Attached to the heatsink (1) is an external electronic device (69). The device (69) engages the heatsink (1) both mechanically and electrically. The device (69) electrically engages conductors (8) that extend the length of the heatsink (1). Mechanically, in this embodiment, mechanical arms (68) with latching brackets (71) embrace the heatsink (1) from both sides. The latching brackets (71) secure the mechanical connectivity by making contact with the heatsink's fins (3).

Elements shown include lens (7), core (2) and surrounding fins (3).

FIG. 11B shows a partial section of the heatsink (1) in a bottom perspective view. The external electronic device (69) is coupled to the bottom of the heatsink (1) with a mechanical arm (68) securing it to the heatsink's fins (3). The external electronic device (69) placement is shown in a section of the heatsink (1) that is unpopulated by light source/s (5). The section shown with light source (5) employs a cross baffle (18) to reduce direct glare. Elements shown include the heatsink's core (2), fins (3) and the cross baffel's cross bars (31).

FIG. 11C shows a partial side elevation of the heatsink (1) with an external electronic device (69) coupled to its bottom.

Elements shown include latching bracket (71), mechanical arms (68), fins (3), and baffle cross bar/s (31).

Figure 12E:
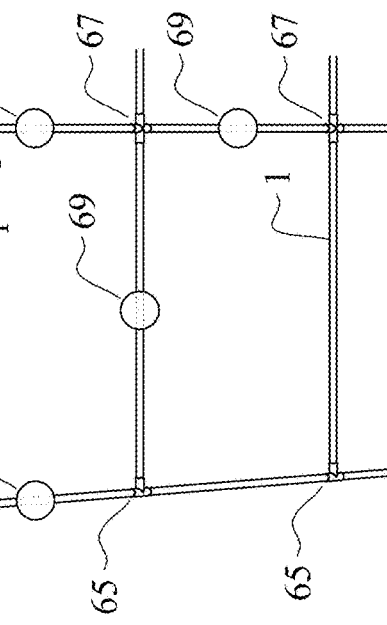
FIG. 12E is a perspective view of a partial canopy of heatsinks that employs the "X", "L" and "T" coupler connectors, in accordance with an embodiment.

FIGS. 12A, 12B, 12C and 12D show a variety of coupler connector types. FIG. 12E shows a partial perspective of a heatsink canopy employing several of the connector types.

Figure 12B:
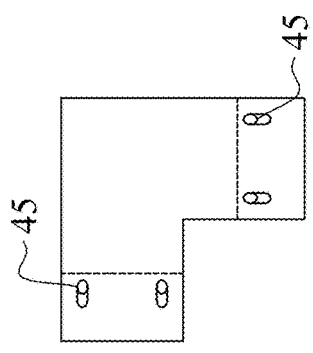
FIG. 12B is a top view of an "L" connector, in accordance with an embodiment.
Figure 12D:
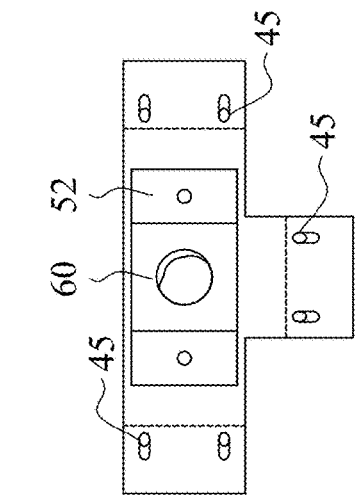
FIG. 12D is a top view of a "T" connector, in accordance with an embodiment.
Figure 12A:
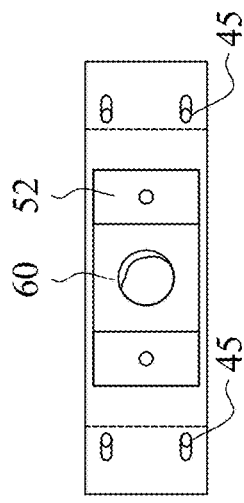
FIG. 12A is a top view of a straight intermediate coupler joiner, in accordance with an embodiment.

FIG. 12A shows a straight intermediate coupler joiner (51) as also described in FIG. 3C and FIGS. 6A, 6B and 6C.

FIG. 12B, referred herein as "L" connector (66), is a 90° elbow connector.

Figure 12C:
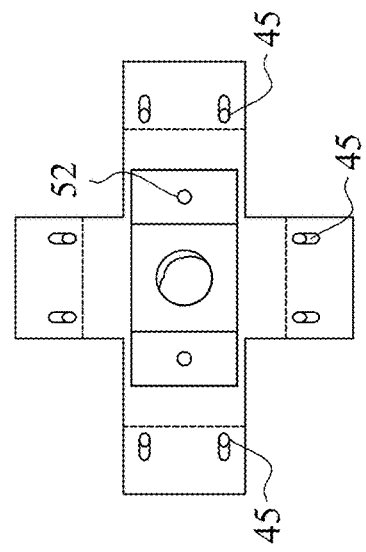
FIG. 12C is a top view of an "X" connector, in accordance with an embodiment.

FIG. 12C, referred herein as "X" (67) connector, engages as many as four heatsinks (1) at 90° to one another.

FIG. 12D, referred herein as "T" (65) connector, engages as many as three heatsinks (1), two abutting each other and one at 90° perpendicularly to the others.

FIG. 12E shows a partial canopy perspective that employs the "X" (67), "L" (66) and "T" (65) coupler connectors. This embodiment is octagonal. In another embodiment (not shown) the connectors can be fabricated to enable angular adjustability. Coupler connector types "X", "L", "T" and the intermediate coupler can receive power or power and data from above.

FIGS. 13A and 13B show embodiments of the coupler connector (42) power and data circuitry. In both of these embodiments the light source (5) driver (17) is integral to the heatsink (1). The driver (17) in another embodiment can be remote.

FIG. 13A shows two partial sections of the heatsink (1) coupled. The male coupler connector (36) conveys power or power and data to the female coupler connector (37). The power conductor/s (47) and an optional data conductor/s (48) run through the coupled heatsink (1) array connecting at the couplers (36,37). Circuitry inside the female coupler (37) tap onto the through power or power and data conductors (47,48) diverting power and bringing data connectivity to its corresponding heatsink's (1) onboard electronic devices. In this figure, power conductor (47) leads connect to a coupler connector device (49) and leads originating with the device connect to a driver (17). The driver (17) leads engage an array of light sources (5) downstream. On the opposite side of the power conductors (47) leads from the data conductor/s (48) connect to the driver (17). In this embodiment the driver (17) may have an onboard processor, a micro switch and a unique address that enables dimming and switching operations. In another embodiment, at least one of the above devices can be embedded inside the coupler connectors (36,37). Yet in another embodiment, wireless means of communication is in direct communication with the integral driver (17) or driver/s inside a coupler hub (43) (not shown) that is coupled to at least one heatsink (1).

FIG. 13B shows two partial sections of the heatsink (1) coupled. The male coupler connector (36) conveys power or power and data to the female coupler connector (37). The power conductor/s (47) and the optional data conductor/s (48) run through the heatsink (1) array connecting to the couplers (36.37). Circuitry inside the female coupler (37) tap onto the through power or power and data conductors diverting power and bringing data connectivity to its corresponding heatsink's (1) onboard electronic devices.

This figure differs from FIG. 13A by showing power to other than light source (5) originating at the driver (17). The driver (17) can also become a power supply to other devices having a plurality of output ports and control ability. Also shown in this figure is a direct device controllability through data conductor (48). In another embodiment (not shown) the onboard electronic devices may have direct power connectivity tapping into the power conductors (47) or through tributary conductors originating at the female coupler connector (37). As is in FIG. 13A the data communication can be wireless.

Mechanical

Figure 14B:
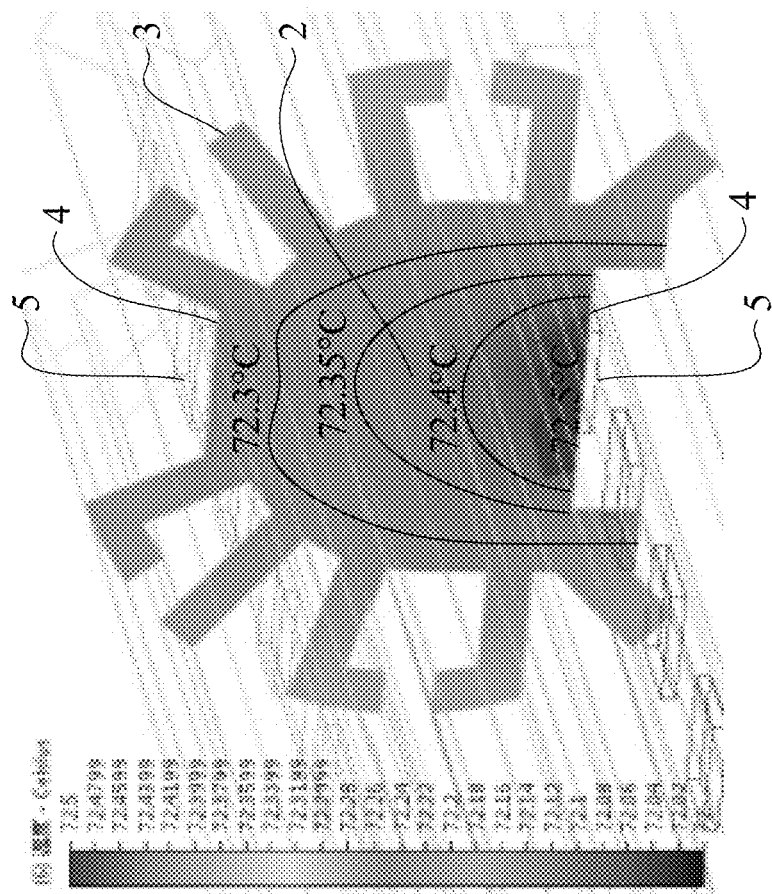
FIGS. 14A and 14B depict thermal analysis calculations of two sections of a heatsink, in accordance with an embodiment.
Figure 14A:
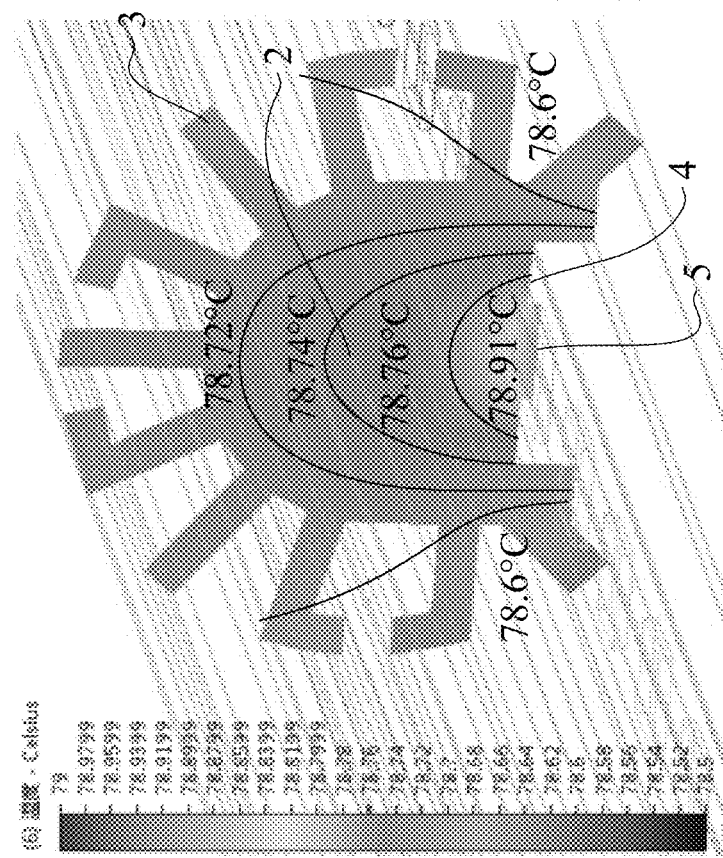

FIGS. 14A and 14B show thermal analysis calculations of two heatsink sections.

FIG. 14A shows the result of a CFD calculation of a heatsink (1) cross-section at its hottest location along its longitudinal length. This embodiment shows the heatsink (1) light source (5) coupled to a single flat surface (4) on the heatsink exterior surface (4). The result shown represent the heat dissipation performance of the heatsink (1) coupled with a light source (5) in a hot ambient environment. The result show that the hottest area is at the junction point (Tj) where the light source (5) is/are coupled to the flat light source retaining surface (4) of the heatsink (1). From there the heat absorbed by the core's (2) central region migrates in a radial fashion outwardly to the core's exterior surfaces (22) and to the heat dissipating fins (3). The most intense heat level beyond the junction point (Tc) concentrates around the core's (2) center. The result shown represents a preliminary proof of concept design.

FIG. 14B shows the result of a CFD calculation of a heatsink (1) cross-section at its hottest location along its longitudinal length. This embodiment shows the heatsink (1) light source (5) coupled to two flat surfaces (4) disposed at 1800 to one another on the exterior surface (22) of the heatsink (1). The result shown represents the heat dissipation performance of the heatsink (1) in a room temperature environment (25° C.). The result shows that the hottest areas are at the junction points (Tj) where the light source (5) is/are coupled to the flat light source retaining surface (4) of the heatsink (1), From there the heat absorbed by the core (2) migrate in a radial fashion outwardly to the core's exterior surfaces (22) and to the heat dissipating fins (3). The most intense heat level beyond the junction point (Tc) concentrates around the core's (2) center. The result shown represents a preliminary proof of concept design.

Figures 15A, 15B, 15C:
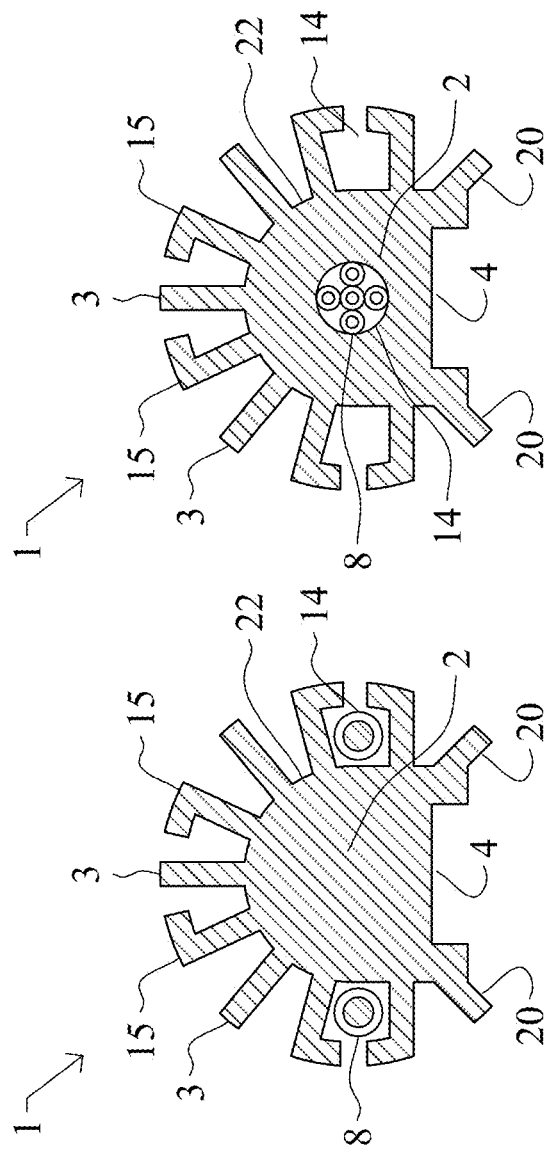
FIG. 15A is a cross-section view of an extruded heat sink with a solid core, in accordance with an embodiment.
FIG. 15B is a cross-section view of an extruded heatsink with a substantially solid core, in accordance with an embodiment.
FIG. 15C is a cross-section view of a molded heatsink with a solid core, in accordance with an embodiment.

FIGS. 15A and 15B show extruded heatsink cross-section profiles, one with a substantially solid core, and the other with a solid core. FIG. 15C shows a cross-section of a molded heatsink with a solid core.

FIG. 15A shows a cross-section of the solid core (2) heatsink (1) fabricated by a process of extrusion. In this embodiment, the fins (3) extend the length of the heatsink (1) and are arranged radially about the heatsinks' (1) core (2) center. The fins (3) are monolithically fabricated with the core (2) and arranged parallel to the heatsink's (1) longitudinal axis. This arrangement reduces the heatsink's surface exposure to free-flowing air compared with perpendicularly arranged fins; however, it can increase the air flow turbulences surrounding the heatsink (1), thus improving the heat dissipation. The process of extrusion with integral fins extending outwardly from the core improves the heatsink's (1) rigidity and reduces the width/depth dimensions of this linear embodiment. The parallel arranged fins (3) provide at least one of the following utilities:

A full or partial longitudinal opening/chase (14) extending the length of the heatsink (1) through which power or power and data conductors run.

A partial or full heatsink's (1) length surface from which the heatsink can be suspended or mounted employing a hanger (12) or a bracket (19).

A reflector (20) and/or a mounting surface for a cross baffle (18) glare mitigating device (18).

A partial or full heatsink (1) length surface to mechanically couple an electrical device (9) and/or non-electrified device.

The embodiment's elements shown include heatsink (1), core (2), fins (3), light source (5), die (6), lens (7), conductor (8), hanger (12), opening/chase (14), hanger fin (15), and cross baffle (18). The cross baffle (18) may be affixed or coupled to the heatsink (1) mechanically, wherein in one embodiment the cross baffle (18) can slide on or pop into position (not shown).

FIG. 15B shows a cross-section of the substantially solid core (2) of a heatsink (1) fabricated by a process of extrusion. An opening/chase (14) is shown at the core's (2) center. In this embodiment, the fins (3) extend the length of the heatsink (1) and are arranged radially about the heatsinks' (1) core (2) center. The fins (3) are monolithically fabricated with the core (2) and arranged parallel to the heatsink's (1) longitudinal axis. This arrangement reduces the heatsink's (1) surface exposure to free-flowing air compared with perpendicularly arranged fins (3), however, it can increase the air flow turbulences surrounding the heatsink (1), thus improving the heat dissipation. The process of extrusion with integral fins (3) extending outwardly from the core improve the heatsinks' (1) rigidity and reduce the width/depth dimensions of this linear embodiment. The parallel arranged fins (3) provide at least one of the following utilities:

A full or partial longitudinal opening/chase (14) extending the length of the heatsink (1) through which power or power and data conductors run.

A partial or full-length surface from which the heatsink can be suspended or mounted employing a hanger (12) or a bracket (19).

A reflector (20) and/or a mounting surface for a cross baffle (18) glare mitigating device (18).

A partial or full heatsink (1) length surface to mechanically couple an electrical device (9) and/or non-electrified device.

The embodiment's elements shown include heatsink (1), core (2), fins (3), light source (5), die (6), lens (7), conductor (8), hanger (12), opening/chase (14), hanger fin (15), and cross baffle (18). The cross baffle (18) may be affixed or coupled to the heatsink (1) mechanically, wherein in one embodiment the cross baffle (18) can slide on or pop into position (not shown).

FIG. 15C shows a cross-section of the substantially solid core (2) with an opening/chase (14) on top. The heatsink is fabricated by molding. In this embodiment, the fins (3) shown are perpendicular to the longitudinal axis of the heatsink (1). The fins' (3) perpendicular position to the heatsink (1) maximizes the embodiment's exposure to free-flowing air. The fins on top and bottom can be formed to have additional utility including providing surface/s for the heatsink's (1) hanger/s and the hanger (12) and/or a reflector (20) shaping the emitted light pattern. The process of molding the heatsink (1) requires costly equipment, the heatsink is more susceptible to cracking, and produces lower heat conductivity. Therefore, the use of this process is more suitable to low mounting applications specifically replacing existing fluorescent luminaire lamps. Elements shown include the heatsink (1), core (2), fins (3), lens (7), light source (5), die (6), conductor (8), cross baffle (18), reflector (20), and hanger (12).

FIGS. 16A, 16B and 16C show extruded heatsink profiles with lamp retaining surface at the embodiments' core top, core bottom and the core's bottom and top.

FIG. 16A shows a profile of the extruded heatsink (1) with flat surface (4) at the core's (2) top surface. This configuration provides indirect illumination utilizing the plane above the heatsink (1) to act as a reflector reflecting the light downwardly. For wider illumination, a wider hanger (12) is used. This embodiment shows the light source (5) and the die (6) mounted on the core's (2) flat surface (4) with a lens (7) wedged between the two hanger fins (15). Since the light is concealed between two fins, no glare mitigation device is needed. An LED light source's natural light dispersion is approximately 120° from the light source's perpendicular axis center. An optically altering lens (7) can be used for a wider or narrower beam distribution pattern. The light is dispersed in a conical fashion from the lamp center. The lens (7) and reflector (20) as shown formed by the fins (3) in this embodiment can augment the light dispersion.

FIG. 16B shows a profile of the extruded heatsink (1) with a flat surface (4) located at the core's (2) bottom. The heatsink (1) is configured to illuminate the surface below and be suspended from above employing a hanger (12) or mounted to a structural member/s employing a bracket/s (19) (also not shown). The hanger (12) is retained by two hanger fins (15) that allow the hanger to travel laterally along the length of the heatsink (1). On both sides of the heatsink (1) at least one fin (3) can be extruded to form a partial or full opening/chase (14) extending the length of the heatsink (1). In this embodiment, two fins (3) form a partially enclosed opening/chase (14) leaving between them a gap for venting hot air. The opening/chase (14) forms a wireway for power or power and data conductors (11). The conductors extend from one end of the heatsink (1) to the other end. Coupling heatsinks forms a continuous opening/chase (14) wireway eliminating a need to provide individual power or power and data feeds to luminaires and other luminaire mounted electronic devices (9). Power or power and data feeds to any one heatsink device typically, but does not always, occur at the heatsink's (1) electrical coupler connector (11). The downwardly aimed light source (5) in this embodiment is coupled to a die (6). The die is coupled to the heatsink's (1) core (2) flat surface (4) with a lens (7) covering the light source (5). The die (6) may employ a medium that facilitates best thermal conductivity. Heat generated by the light source (5) is absorbed by the heatsink's core (2) and is conveyed to the fins (3). The fins (3) and partially the core (2) exterior are exposed to free-flowing air. Below the lamp's lens (7), a cross baffle (18) is shown mitigating unpleasant lighting glare. The use of the cross baffle (18) is optional and is dependent on several factors including relative visual comfort standards, visual acuity requirements, luminaire mounting height, light output intensity, and volume of apparent glare causing light.

FIG. 16C shows a profile of the extruded heatsink (1) with a flat surface (4) at the bottom and the top of the heatsink core (2). This embodiment's light dispersion is bi-directional. Typically, the uplight portion of the light dispersion is lesser than the downlight portion that serves as ambient lighting. Both the single and the bi-directional light source array can be switched on/off and dimmed, whereas the bi-directional array can be controlled independently of one other light orientation. In addition, the light source color temperature, chromaticity, and light output may vary between lamps on the same flat surface (4) and/or opposing flat surfaces (4).

FIGS. 17A, 17B and 17C show industry standards for fluorescent lamp electromechanical connectivity. 17A for single pin, 17B for RDC and 17C for bi-pin.

FIG. 17A shows a single pin electrical fluorescent contact. This contact is the light source's means of electromechanical connectivity. The single pin contact is associated with a high output fluorescent light source. The heatsink (1) can meet or exceed the high output of such a fluorescent light source. For simplicity reasons, the heatsink (1) employed as a retrofit to this fluorescent light source shall use a bi-pin connector (23) configuration or a new construction employing either keyed sliding connector (27) or coupler connector (42). The coupler connector (42) and the keyed sliding connectors (27) require the change of the lamp holder (24) and a ballast replacement or disengagement.

FIG. 17B shows an RDC electrical fluorescent contact. This contact is the light source's means of electromechanical connectivity. The RDC contact is associated with a very high output fluorescent light source. The heatsink (1) can meet or exceed the very high output of such a fluorescent lamp. However, for simplicity reasons, the heatsink (1) employed as a retrofit to this fluorescent lamp shall use a bi-pin connector (23) contact configuration or a new construction contact referred to as coupler connector (42) or keyed sliding connector (27). Both the coupler connector (42) and the keyed sliding connector (27) require the change of the lamp holder and a ballast replacement or disengagement.

FIG. 17C shows a bi-pin (23) fluorescent electrical contact. This electromechanical means of contact is widely used industry-wide. The space in between the lamp's pins varies between a T5 lamp and T8 and T12 lamps. For simplicity reasons, the heatsink (1) and connector shall be standardized on present lighting industry bi-pin (23) means of electromechanical connectivity. Many of the existing fluorescent luminaires today employ a venting slot positioned directly above and along the fluorescent lamps. The heatsink (1) with downlight only employs such a slot as a venting aperture. The heatsink that includes uplight can also disperse the uplight through the venting hole, reducing or elimination cave effect.

FIG. 18 shows the heatsink's means of electromechanical connectivity. FIG. 18A shows a partial perspective view of a bi-pin connector with an integral driver and a corresponding lamp holder. FIG. 18B shows a perspective view of a coupler connector with an integral driver and a reciprocating coupler connector. FIG. 18C shows a partial perspective view of a sliding connector with an integral driver and reciprocating keyed sliding connector receptacle.

FIG. 18A shows a partial perspective view of the heatsink (1) engaging a conventional fluorescent bi-pin (23) lamp holder (24). The lamp holder (24) provides both mechanical and electrical connectivity between the lamp and the luminaire.

Retrofitting existing fluorescent luminaires doesn't require the change of the existing lamp holder (24) as the heatsinks' (1) electromechanical contacts' pin configuration is the same as the connectivity standard for a bi-pin fluorescent lamp. This partial perspective view shows the heatsink (1) with an integral driver (17) engaging a conventional fluorescent lamp holder (24). Retrofitting a fluorescent lamp luminaire with a heatsink (1) that is coupled to an integral driver requires disabling, or disabling and discarding the fluorescent ballast. It may also require altering the luminaire's electrical circuitry.

The advantages of having an integral driver (17) coupled to the heatsink (1) include:
1. Better heat dissipation for driver.
2. Easy replacement at system's end of life.
3. When failure occurs, it affects only a single heatsink.
4. Ability to electrically couple other devices to the driver circuitry.

The latter foresees expanding the driver's functionality to include the capacity to provide at least one of:
1. Control lighting and/or other device's.
2. Communicate with local and remote devices.
3. Power at least one other device than a light source.

The devices that can be powered or power and controlled by the driver (17), can be internal, external, or placed remotely with power or power and data connectivity between the other device/s and the driver.

In a different embodiment (not shown) the driver (17) is placed inside a luminaire enclosure. In such application/s the existing ballast needs to be disconnected and discarded and the luminaire's power circuitry may need to be re-done.

Elements shown in this figure include partial heatsink (1), fins (3), lens (7), cross baffle (18), heatsink end cap (25), driver (17), and a lamp holder (24).

FIG. 18B shows a partial perspective view of two heatsinks employing coupler connectors (42), one with an integral driver (17) and the other without. A male coupler connector (36) couples with a female coupler connector (37), forming power or power and data conduit connectivity enabling flow of power and data from one heatsink (1) to the other. The coupler connector (42) is keyed and is typically employed in an array arrangement of heatsinks (1). Each heatsink (1) can retain a driver (17) on one end with coupler connectors providing connectivity between them. The coupler connector (42) may also have tributary conductors drawing power from the through conductors delivering the power to the local heatsink's onboard electrical devices. In addition, the coupler connector (42) may retain electronic devices, provide switching capability and communication capability, and may retain a unique addressable address. The coupler connector (42) is typically factory coupled to the heatsink (1) and delivered ready for quick installation. The coupler may connect with other reciprocating couplers coupled to devices aside from other heatsinks. Such devices may include coupler hub (43), end coupler joiner (50), and an intermediate coupler joiner (51).

This heatsinks (1) embodiment with an integral driver (17) coupled to the coupler connector (42) is suitable for new construction. The connector provides power or power and data connectivity. It also provides lateral connectivity between heatsink sections. This mechanical means of connectivity enables the heatsink's thermal expansion without power or power disruption. However, it doesn't support the weight of the heatsinks' assembly. Hanger/s (12) or bracket/s (19) are tasked with supporting the assembly's weight.

The advantages of having an integral driver (17) coupled to the heatsink (1) include:
1. Better heat dissipation for driver.
2. Easy replacement at system's end of life.
3. When failure occurs, it affects only a single heatsink.
4. Ability to electrically couple other devices to the driver circuitry.

The latter foresees expanding the driver's functionality to include the capacity to provide at least one of:
1. Control lighting and/or other device/s.
2. Communicate with local and remote devices.
3. Power at least one other device than a light source.

The devices that can be powered or powered and controlled by the driver, can be internal, external, or placed remotely with power or power and data connectivity between the other device/s and the driver.

In a different embodiment (not shown) the driver (17) is placed inside a coupled enclosure including a coupler hub (43), electronic device housing (13) and/or an electronic device coupler (46).

FIG. 18C shows a partial perspective view of the keyed sliding connector (27) with its corresponding sliding connector receptacle (61). The keyed sliding connector (27) employs a keyed extension that roots on a reciprocating keyed seat of the sliding connector receptacle (61).

The sliding connector can convey power or power and data from and to heatsink/s (1). The heatsink's (1) are typically coupled to sliding connector's receptacle (61). The receptacle (61) is coupled to a sliding connector J box (28), or an electronic device housing (13) (not shown). The electronic device housing (13) may also be coupled to the sliding J box (28) absent of sliding connector receptacle/s (61).

The heatsink (1) employing a keyed sliding connector (27) is typically employed with new construction. As with coupler connected heatsinks (1), the slider connector may be coupled at one end to an integral driver (17). The sliding connector J box (28) then conveys power from one heatsink (1) embodiment to the next through the box. The box may also receive power or power and signal from external source and distribute the power or power and signal to the coupled heatsink.

The J box (28) may have several sliding connector receptacles (61) and the receptacles can be distributed along the exterior face of the J box (28) in a variety of angular distributions (not shown). The J box (28) may also retain electronic devices inside its enclosures and/or on its exterior surfaces.

The electronic device housing (13) is typically employed when driver (17) or other electronic equipment such as back-up power, transceiver, control equipment, surveillance equipment, and/or audio equipment may be employed.

The electronic device housing (13) has an operable door and the devices can be placed inside, on its exterior surfaces, or in combination thereof. The electronic device housing (13) can be directly coupled to sliding connector receptacles (61) or to a sliding connector J box (28). The electronic device housing (13) receives its power or power and signal from external source and distribute the power to the heatsinks (1) downstream.

Returning to the sliding connector assembly: on top of the heatsink's (1) keyed extender bar (73), the vertical pin projection (38) enables lateral mobility for the heatsink (1). The heatsink (1) is expected to be employed in unconditioned environments where the heatsink embodiment will be subject to thermal expansion. The keyed sliding connector (27) is configured to allow lateral mobility without losing electrical or electrical and data connectivity. The keyed extender bar (73), once resting inside the sliding connector receptacle (61), is secured in position by the sliding connector cover (63). The cover has a slotted opening (62) that enables the pin projection (38) to travel within limits.

Elements shown include: driver (17), keyed extender bar (73), sliding connector cover (63), and pin projection (38).

FIG. 19A shows a partial top perspective of heatsinks positioned to be coupled on to a sliding connector J box (28). FIG. 19B show top perspective of two partial heatsinks with coupler connectors coupled FIG. 19A shows a partial top perspective of two heatsinks (1) suspended by hangers (12). The assembly is coupled employing keyed sliding connectors (27). The keyed connectors enable power flow from one heatsink to another as well as bi-directional data connectivity. The keyed sliding connector (27) may have conductors drawing power from the heatsink through power connectivity and other conductor/s establishing data connectivity to the local heatsink electronic device/s.

In this embodiment, the sliding connector (27) at the heatsinks' (1) end has a keyed extender bar (73) protrusion. The keyed extender bar (73) rests on a reciprocating sliding connector receptacle (61). The connector has a cover (63) that locks the sliding connector (27) in position preventing vertical heatsinks' (1) mobility once secured. When the cover (63) is secured in place, a vertical pin (64) projecting upwardly from the keyed extender bar (73) top surface is able to travel latterly inside a slotted opening (62) in the cover (63). The heatsinks' lateral travel allowance is to relieve thermal stress while maintaining power and data connectivity. The heatsinks' travel is limited to the length of the slot (62).

The keyed sliding connector (27) provides lateral mechanical connectivity. However, hangers (12) or brackets (19) mounted at the top of the heatsink (1) carry the assembly load transferring it to the above structure. The hanger/s (12) are configured to engage the hanger fins (15) located at the top of the heatsink (1). This keyed sliding connector (27) configuration enables the hanger (12) to slide along the length of the heatsink (1), shortening the installation time. The dimension of the hanger width is contingent on the fins' (3) and the heatsink's optical arrangement. The flexibility built into the hanger placement also reduces conflicts with other ceiling systems and likelihood of roof membrane penetration.

The keyed sliding connector (27) typical connects to a sliding connector J box (28). The J box (28) may convey power or power and data only. It can also be coupled to electronic devices. The J box (28) may be coupled to an electronic device housing (13) or the sliding connector receptacle/s (61) can be coupled directly to an electronic device housing (13). Elements shown include partial assembly of heatsink (1), keyed connector (26), fins (3), aircraft cable (29) and hanger (12).

FIG. 19B shows a partial top perspective of a pair of heatsinks (1) with reciprocating coupler connectors (42). One of the heatsinks is coupled to an integral driver (17) where the other has no driver (17). Coupling heatsinks (1) in this manner enables forming a continuous array of heatsinks (1) with power or power and data running through the length of the array. The coupler connectors (42) are factory coupled to the heatsink (1) at both ends ready for quick field assembly. The couplers are keyed with a female coupler connector (37) on the upstream side of the heatsink and a male coupler connector (36) on the downstream side of the heatsink. Typically, power or power and data tributaries built into the female coupler connector (37) connect to the power or power and data conductors and draw power or power while establishing electrical connectivity to the local heatsinks' (1) electrical devices. The female coupler connector (37) may include other built-in electronic devices.

The male and female coupler connectors (36,37) employ both reciprocating keyed power or power and data connectors and a mechanical coupler joiner (41). The coupler joiner (41) engages two heatsinks' (1) sections by securing the heatsinks (1) to one another using a couple of screws with each coupler. The bores for the screws on one side can be slotted to enable lateral movement without breaking the power or power and data connectivity. The coupler joiner (41) can be factory mounted and shipped installed to one end of the heatsink (1).

In addition, there are other devices employing the coupler connector's (42) means of connectivity. These devices convey power or power and data to, from, and to and from single heatsink (1) sections or a contiguous section array. These connectors include end coupler joiner (50), intermediate coupler joiner (51) and coupler hub (43). The couplers are employed in conjunction with ingress/egress of external power or power and data to the couplers and/or coupling of electronic devices to the coupler connectors (42).

In the embodiment shown, the heatsink assembly is typically suspended by hangers (12) from the structure above. It can also be mounted below a structure using brackets (19) (not shown). Both hangers' (12) and brackets' (19) profile can be keyed to engage a reciprocating key hanger fin (15) formed from at least one of the heatsink's fins (3). The configuration of the reciprocating fins key enables sliding the hanger/s (12) or bracket/s (19) along the length of the heatsink (1). Elements shown in this figure include keyed coupler connector (26,42), driver (17), lens (7) hanger (12) fin (3) and hanger fin (15).

FIG. 20A show a partial elevation of coupled heatsinks suspended from above by hanger secured to aircraft cable or chain. FIGS. 20B and 20C show partial top perspectives of the heatsink with narrow and wide heatsink hangers engaging reciprocating hanger fin/s.

FIG. 20A shows a partial elevation of two heatsinks coupled employing coupler connectors (42) and suspended from above structure by aircraft cable. In this embodiment the cable is secured to hanger/s (12). The hangers are free to travel the length of the heatsink (1) mechanically engaging hanger fin/s (15) position at the top of the heatsink.

FIG. 20B shows a perspective view of a hanger (12) configured to support a heatsink (1) with a downlight lamp array. Elements shown include the heatsink profile (30), aircraft cable (29), the hanger fins (15), and the hanger (12).

The heatsink (1) may employ one or several hangers (12). Additional hangers are used when the heatsink supports other than its own weight.

FIG. 20C shows a perspective view of a hanger (12) configured to support a heatsink (1) with a bi-directional lamp array.

Elements shown include the heatsink profile (30), aircraft cable (29), lens (7), the hanger fins (15), and the hanger (12).

FIGS. 21A, 21B and 21C show a partial perspective, a section and a partial bottom elevation of the heatsink employing a cross baffle.

FIG. 21A shows a perspective of the heatsink's (1) longitudinal view from and below the keyed connector (26).

In an aisle where a plurality of heatsinks (1) are oriented parallel to the direction of travel, glare can become intrusive. For this, a glare mitigating device such as a cross baffle (18) can reduce or eliminate the light source's direct glare. The glare mitigating device can be made of metallic or non-metallic material, and/or it can be painted and be coupled to a larger assembly that contains other optically augmenting light source devices.

The cross baffle (18) glare mitigating device can be affixed, screwed, fastened, popped or slid onto reciprocating surface on the heatsink (1). In one embodiment (not shown) tracks in the light source aperture fins facilitate sliding the cross baffle (18) glare mitigating device. In another embodiment, the cross baffle (18) glare mitigating device can be flexed into position. In yet another embodiment (not shown), retaining tracks built into the cross baffle (18) glare mitigating device can wrap around the light source aperture fins and slide across the heatsink (1). The placement of the cross baffle's (18) cross bar (31) is between the light sources to prevent loss of light. The glare mitigating device can extend the length of the heatsink (1) or be shorter.

FIG. 21B shows an exemplar section of the cross baffle (18) mounted onto the heatsink (1). Elements shown include heatsink (1), light source retaining flat surface (4), fins (3), light source die (6), light source (5), cross bar (31), and the cross baffle assembly (18).

FIG. 21C shows an exemplar bottom view partial perspective of the extruded heatsink (1) body retaining a glare mitigating cross baffle (18). Elements shown include heatsink (1) light source (5), light source retaining flat surface (4), fins (3), and cross bar (31).

Figures 22A, 22B:
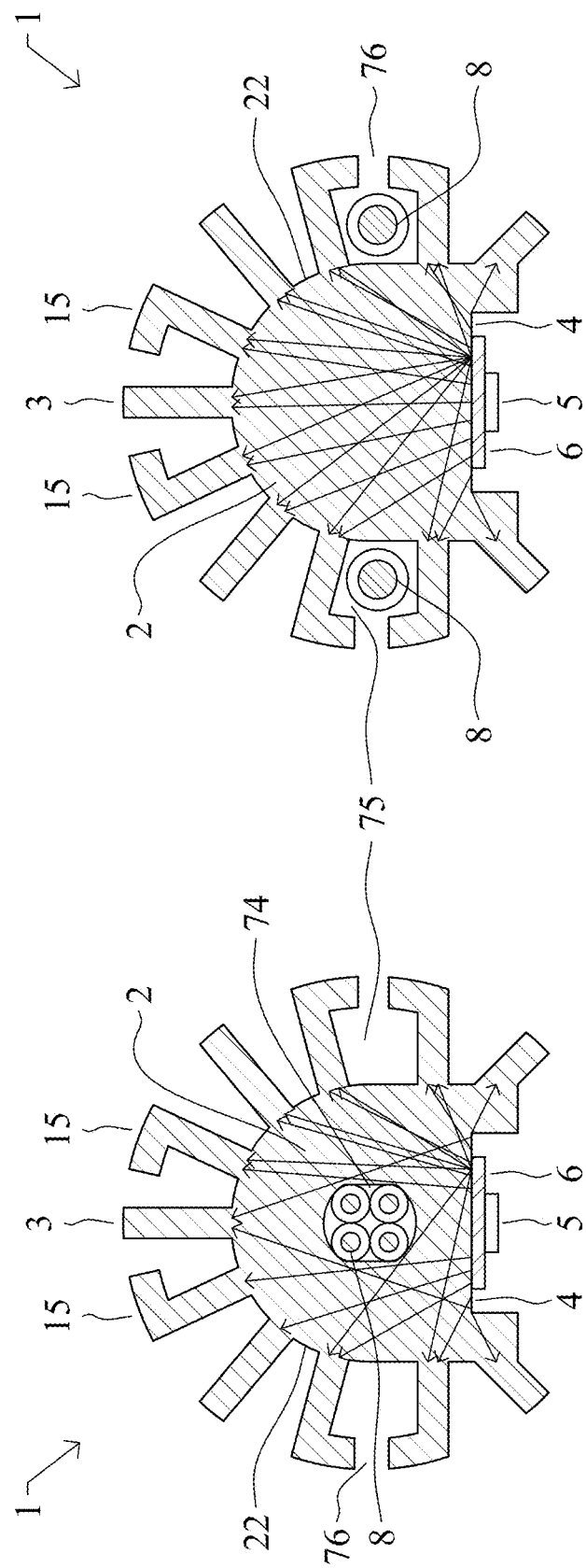
FIG. 22A is a transverse section view of the heat sink with an opening at its core, in accordance with an embodiment.
FIG. 22B is a transverse section view of the heat sink with a solid core, in accordance with an embodiment.

FIGS. 22a and 22b show examples of light source (5) heat dispersion means of conveyance through the embodiment's heat sink (1) core (2). The core's capacity to absorb light source (5) heat and rapidly distribute the load to a plurality of fins (3) allows for an increase in light output while employing a reduced heat sinks cross-sectional profile, and reduced weight, material cost, freight cost and environmental impact.

FIG. 22a shows a transverse section of the heat sink (1) with an opening at its core (74) for power or power and data conveyance. At the bottom a die (6) with a light source (5) is coupled to the heat sink's (1) core (2) at the light source retaining flat surface (4). Heat generated by the light source (5) is sunken through the die (6) into the core surface and from there, travels by conduction to the monolithically fabricated fins (3) coupled to the core (2).

At the bottom a die (6) with a light source (5) is coupled to the heat sink's (1) core (2) at the light source retaining flat surface (4). Heat generated by the light source (5) is sunken through the die (6) into the core (2) surface and from there, travels by conduction to the monolithically fabricated fins coupled to the core (2).

Arrows drawn across the core (2) depict an exemplary path of the heat generated conveyance to the majority or all the heat dissipating fins (3). For illustration purpose, one set of arrows originates at the same point and a plurality of arrows are shown spread across the light source retaining flat surface (4).

The heat dissipating fins (3) shown in this figure are generally arranged in a radial fashion around the core's (2) center. In another embodiment, the core (2) cross-sectional form can be different and so can be the arrangement of the heat dissipating fins (3). The fins (3) and the core (2) are monolithically fabricated.

FIG. 22b shows a transverse section of the heat sink with a solid core (2). In this embodiment power or power and data conductors (8) are conveyed along the exterior surface (22) of the core (2) in an opening (75) formed by at least one heat dissipating fin (3).

At the bottom a die (6) with a light source (5) is coupled to the heat sink's (1) core (2) at the light source retaining flat surface (4). Heat generated by the light source (5) is sunken through the die (6) into the core (2) surface and from there, travels by conduction to the monolithically fabricated fins coupled to the core (2).

Arrows drawn across the core (2) depict an exemplary path of the heat generated conveyance to the majority or all the heat dissipating fins (3). For illustration purpose, one set of arrows originates at the same point and a plurality of arrows are shown spread across the light source retaining flat surface (4).

The heat dissipating fins (3) shown in this figure are generally arranged in a radial fashion around the core's (2) center. In another embodiment, the core (2) cross-sectional form can be different and so can be the arrangement of the heat dissipating fins (3). The fins (3) and the core are monolithically fabricated.

Figure 23:
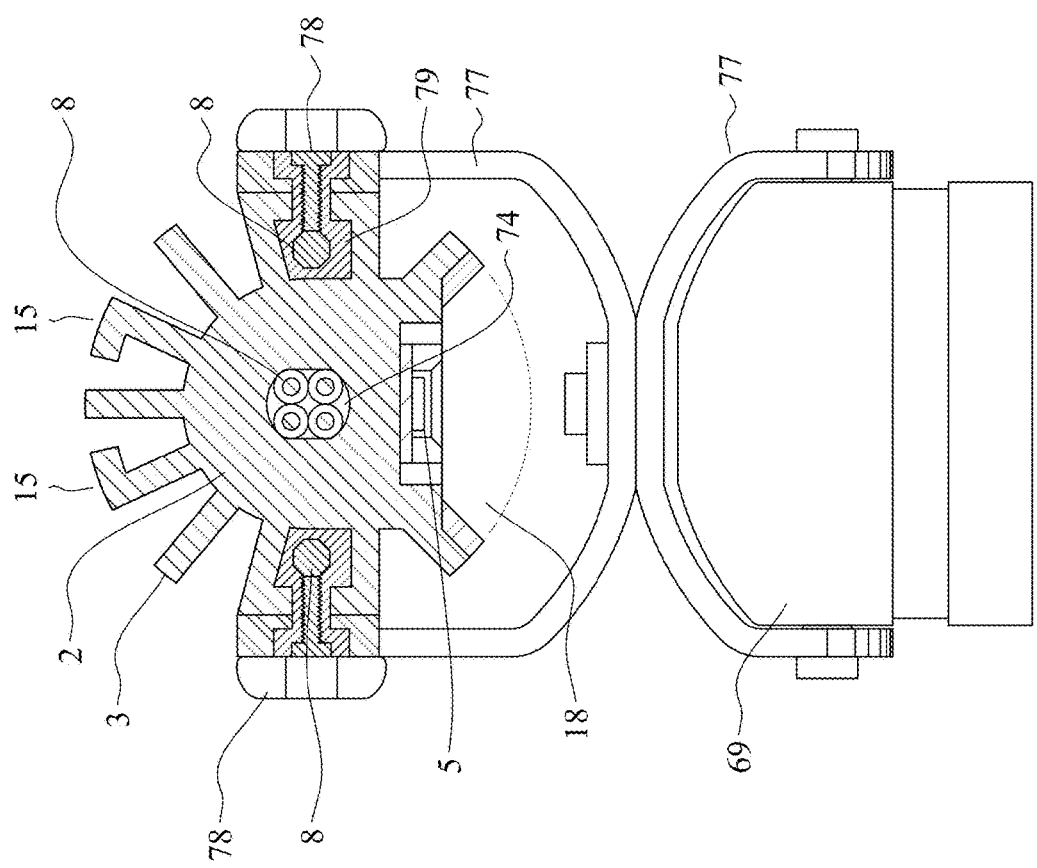
FIG. 23 is a transverse section view of the heat sink with a conductor conveying opening at the core center and on both sides of exterior enclosures formed by a couple of heat dissipating fins at each side, in accordance with an embodiment.

FIG. 23 shows a transverse cross-section of the heat sink with a conductor (8) conveying opening at the core (74) center and on both sides of the heat sink's exterior enclosures formed by a couple of heat dissipating fins (3) at each side. The enclosure (75) extends at least most of the heat sink (1) length with power conductors (8) inside. In this embodiment, the power conductors (8) are insulated (79) from making contact with the heat sink's (1) metallic body. In another embodiment not shown, the heat sink (1) can be fabricated of non-metallic material eliminating the need to isolate the conductors (8) from the body. The conductors (8) extending substantially the length of the heat sink (1) are embedded in an enclosure with slotted opening (76) to the outside also extending substantially the length of the heat sink (1). Element (69) shown below the heat sink (1) is an exemplary embodiment of an external removable electronic device (69) that can be coupled to the heat sink (1). The device shown is coupled to a top mounted yoke (77) that conveys power from the heat sink's (1) conductors (8). The yoke (77) can rotate and be aimed. At the top fly screws (78) engage the heat sink's (1) conductors (8) also providing a secured mechanical connectivity. The device can be placed anywhere along the slotted opening (76) and a number of the same or different devices can be placed on one heat sink (1) simultaneously. A limiter typically placed at one end of the heat sink (1) can control the allowable electrical load on the conductors (8). Devices placed on the heat sink (1) can be electrified and non-electrified. Electrified devices can provide processing, communication, sensing, recordation, alerting, and monitoring utility. The slotted openings (76) extending the length of the heat sink (1) also provides mechanical support for non-electrified devices.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A monolithic linear heatsink comprising:
 a solid or substantially solid core having a longitudinal opening that extends along a length of the core;
 a plurality of heat dissipating fins extending outwardly from an exterior surface of the core, wherein the exterior surface of the core defines at least one flat surface;
 at least one light source disposed on the at least one flat surface of the core; and
 a power or a power and data conductor extending through the longitudinal opening of the core, wherein heat generated by the at least one light source directly propagates radially and contemporaneously through a solid portion of the core to two or more of the heat dissipating fins coupled to the core, wherein a first area of the solid portion of the core is greater than a second area of the longitudinal opening of the core, and wherein the first area and the second area are measured at a section along axis transverse to the length of the core.

2. The heatsink of claim 1, further comprising at least two conductors retained by the core and electrically engaging an external detachable device.

3. The heatsink of claim 1, further comprising a device coupled to the at least one light source, wherein the device augments natural light distribution pattern of the at least one light source.

4. The heatsink of claim 1, further comprising a light source driver coupled to the core.

5. The heatsink of claim 1, wherein the power or the power and data conductor conveys power or power and data to at least one conductor of another heatsink.

6. The heatsink of claim 1, further comprising an externally mounted detachable electronic device having sensing, communication, and/or processing capabilities.

7. The heatsink of claim 1, further comprising at least one bracket configured to engage at least one of the heat dissipating fins to mechanically support the core, wherein the bracket is movable along a length of the at least one of the heat dissipating fins.

8. A monolithic linear heatsink comprising:
 a solid or substantially solid core;
 a plurality of heat dissipating fins extending outwardly from an exterior surface of the core, wherein the exterior surface of the core defines at least one flat surface;
 at least one light source disposed on the at least one flat surface of the core; and
 a power or a power and data conductor is conveyed thorough at least one of at least one partial or full enclosure defined by at least one of the plurality of heat dissipating fins and a longitudinal opening of the core, wherein heat generated by the at least one light source propagates radially and contemporaneously through a solid portion of the core to two or more of the heat dissipating fins coupled to the core, wherein a first area of the solid portion of the core is greater than a second area of the longitudinal opening of the core, and wherein the first area and the second area are measured at a section along axis transverse to the length of the core.

9. The heatsink of claim 8, further comprising at least two conductors retained by the core and electrically engaging an external detachable device.

10. The heatsink of claim 8, further comprising a device coupled to the at least one light source that augments a natural light distribution pattern of the at least one light source.

11. The heatsink of claim 8, further comprising a light source driver is coupled to the core.

12. The heatsink of claim 8, wherein the power or the power and data conductor conveys power or power and data to at least one conductor of another heatsink.

13. The heatsink of claim 8, further comprising an externally mounted detachable electronic device having at least one of sensing, communication, and/or processing capabilities.

14. The heatsink of claim 8, further comprising at least one bracket configured to engage at least one of the plurality of heat dissipating fins to mechanically support the core, wherein the bracket is movable along a length of the at least one of the plurality of heat dissipating fins.

15. A monolithic linear heatsink comprising:
 a solid or substantially solid core;
 a plurality of heat dissipating fins extending outwardly from an exterior surface of the core, wherein the exterior surface of the core defines at least one flat surface;
 at least one light source disposed on the at least one flat surface of the core, wherein heat generated by the at least one light source propagates radially and contemporaneously through a solid portion of the core to two or more of the plurality of the heat dissipating fins coupled to the core; and
 at least one externally mounted detachable device mechanically and/or electromechanically coupled to the exterior surface of the core, wherein a first area of the solid portion of the core is greater than a second area of the longitudinal opening of the core, and wherein the first area and the second area are measured at a section along axis transverse to the length of the core.

16. The heatsink of claim 15, further comprising at least two conductors retained by the core and electrically engaging the externally mounted detachable device.

17. The heatsink of claim 15, further comprising a device coupled to the at least one light source that augments a natural light distribution pattern of the at least one light source.

18. The heatsink of claim 15, further comprising a light source driver coupled to the core.

19. The heatsink of claim 15, further comprising a power or a power and data conductor that conveys power or power and data to at least one conductor of another heatsink.

20. The heatsink of claim 15, wherein the externally mounted detachable electronic device includes at least one of sensing, communication and/or processing capabilities.

21. The heatsink of claim 15, further comprising at least one bracket engaging at least one of the plurality of heat dissipating fins, wherein the at least one bracket is movable along a length of the at least one of the plurality of heat dissipating fins.

22. A method comprising:
providing a linear heatsink including
a solid or substantially solid core,
a plurality of heat dissipating fins extending outwardly from an exterior surface of the core, wherein the exterior surface of the core defines at least one flat surface, and wherein the exterior surface of the core retains electrified and/or non-electrified devices, and
at least one light source disposed on the at least one flat surface of the core;
supporting the linear heatsink from at least one selectable support point along a length of the linear heatsink, wherein the linear heatsink includes a structural member that retains electronic devices and conveys power or power and data; and
conveying power or power and data to at least one of: a) a light source; b) at least one of the electronic devices; c) a light source and at least one of the electronic devices; or d) a light source, at least one of the electronic devices, and at least one other light source and/or electronic device coupled to another linear heatsink, wherein conveying power or power and data is through at least one longitudinal opening in the core of the linear heatsink, through an opening defined by at least one of the plurality of heat dissipating fins, or via a combination thereof, wherein conveying power or power and data is along a length of the linear heatsink from one end of the linear heatsink to another end of the linear heatsink, wherein a first area of a solid portion of the core is greater than a second area of the longitudinal opening of the core, and wherein the first area and the second area are measured at a section along axis transverse to the length of the core.

* * * * *